(12) United States Patent
Yan et al.

(10) Patent No.: US 12,477,942 B2
(45) Date of Patent: Nov. 18, 2025

(54) ORGANIC METAL COMPOUND AND APPLICATION THEREOF

(71) Applicant: GUANGDONG AGLAIA OPTOELECTRONIC MATERIALS CO., LTD, Guangdong (CN)

(72) Inventors: Liangliang Yan, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 1021 days.

(21) Appl. No.: 17/297,999

(22) PCT Filed: Nov. 2, 2019

(86) PCT No.: PCT/CN2019/115182
§ 371 (c)(1),
(2) Date: May 27, 2021

(87) PCT Pub. No.: WO2020/134570
PCT Pub. Date: Jul. 2, 2020

(65) Prior Publication Data
US 2022/0115603 A1   Apr. 14, 2022

(30) Foreign Application Priority Data

Dec. 27, 2018 (CN) .......................... 201811610359.5

(51) Int. Cl.
| | |
|---|---|
| C09K 11/06 | (2006.01) |
| C07F 15/00 | (2006.01) |
| H10K 85/30 | (2023.01) |
| H10K 50/11 | (2023.01) |
| H10K 101/10 | (2023.01) |

(52) U.S. Cl.
CPC ....... *H10K 85/342* (2023.02); *C07F 15/0033* (2013.01); *C09K 11/06* (2013.01); *C09K 2211/1033* (2013.01); *C09K 2211/1037* (2013.01); *C09K 2211/1048* (2013.01); *C09K 2211/185* (2013.01); *H10K 50/11* (2023.02); *H10K 2101/10* (2023.02)

(58) Field of Classification Search
CPC ...................................................... C09K 11/06
See application file for complete search history.

(56) References Cited

U.S. PATENT DOCUMENTS

| | | |
|---|---|---|
| 2015/0090981 A1 | 4/2015 | Xia |
| 2018/0273563 A1 | 9/2018 | Choi |

FOREIGN PATENT DOCUMENTS

| | | |
|---|---|---|
| CN | 104393181 A | 3/2015 |
| CN | 106459114 A | 2/2017 |
| CN | 107973823 A | 5/2018 |
| WO | 2006059758 A1 | 6/2006 |

*Primary Examiner* — John S Kenyon
(74) *Attorney, Agent, or Firm* — Maschoff Brennan

(57) ABSTRACT

The present invention relates to an organic metal compound and application thereof. The organometallic compound has a structure as shown in Formula I. The compound provided by the present invention has the advantages of low sublimation temperature, high light and electricity stability, high luminous efficiency, long lifetime, high color saturation and the like, can be used in an organic light-emitting device, and particularly has a possibility of being applied to an AMO-LED industry as a red luminescent phosphorescent material.

20 Claims, No Drawings

ORGANIC METAL COMPOUND AND APPLICATION THEREOF

TECHNICAL FIELD

The present invention relates to the technical field of organic electroluminescence, in particular to an organic light-emitting material suitable for an organic electroluminescence device, and particularly relates to an organic metal compound and application thereof to the organic light-emitting device.

BACKGROUND

At present, an organic electroluminescence device (OLED) as a new generation of display technology has gained more and more attention in aspects of display and lighting technologies, and has very broad application prospects. However, the performance, such as luminous efficiency, driving voltage and lifetime, of an OLED device still needs to be further enhanced and improved in comparison to market application requirements.

Generally, according to a basic structure of the OLED device, various organic functional material thin films with different functions are sandwiched between metal electrodes, like a sandwich structure. Holes and electrons are respectively injected from a cathode and an anode under the driving effect of current. After the holes and the electrons move for a certain distance, they are recombined in a light-emitting layer, and are released in a form of light or heat, thereby generating light emission of the OLED. However, an organic functional material is a core composition of the organic electroluminescence device, and the thermal stability, photochemical stability, electrochemical stability, quantum yield, film forming stability, crystallinity, color saturation and the like of the material are all main factors influencing the performance of the device.

Generally, the organic functional material includes a fluorescent material and a phosphorescent material. The fluorescent material is generally an organic small molecular material and can only emit light by using 25% singlet states, so that the luminous efficiency is very low. Due to a spin orbit coupling effect caused by heavy atom effects, besides the use of 25% singlet states, the phosphorescent material can also use energy of excitons of 75% triplet states, so that the luminous efficiency can be improved. However, compared with a fluorescent material, the phosphorescent material starts later, and needs to be improved in aspects of thermal stability, lifetime, color saturation and the like of the material, and this is a challenging subject. Various organometallic compounds have been developed as phosphorescent materials at present. For example, the invention patent document CN107973823 discloses a class of quinoline iridium compounds, but the color saturation and the device performance, especially the luminous efficiency and the lifetime of the device of the compounds need to be improved; and the invention patent document CN106459114 discloses a class of iridium compounds coordinated by a β-diketone ligand, but the compounds a have high sublimation temperature and a poor color saturation, particularly, the device performance is not ideal, and further improvement is needed.

SUMMARY

One objective of the present invention is to provide a phosphorescent compound which has the advantages of low sublimation temperature, high light and electrochemical stability, high color saturation, high luminous efficiency, long lifetime of a device and the like, can be used in an organic electroluminescence device, and can be particularly used as a red light emitting dopant to be applied to OLED industry.

An organometallic compound has a structural formula as shown in Formula I:

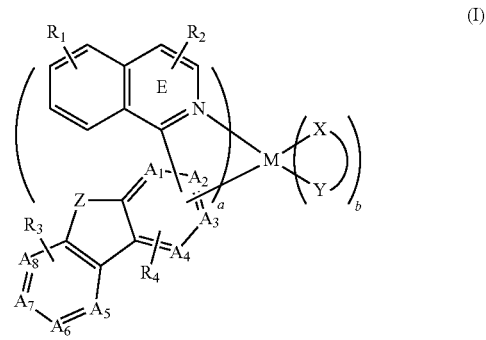

(I)

wherein one in A1 to A4 is a C—C bond connected with a ring E, one is a C-M bond connected with metal M, one is $CR_4$, and another is $CR_0$ or N; one in A5 to A8 is $CR_3$, and the other three are independently represented as $CR_0$ or N; wherein M is a metal with the atomic weight greater than 40;

$R_0$ to $R_4$ are independently selected from hydrogen, deuterium, halogen, a substituted or unsubstituted C1 to C10 alkyl group, a substituted or unsubstituted C3 to C20 cycloalkyl group, a substituted or unsubstituted C1 to C10 heteroalkyl group, a substituted or unsubstituted C6 to C30 aralkyl group, a substituted or unsubstituted C1 to C10 alkoxy group, a substituted or unsubstituted C6 to C30 aryloxy group, an amino group, a substituted or unsubstituted C1 to C10 silyl group, a substituted or unsubstituted C6 to C30 aryl group, a substituted or unsubstituted C1 to C8 heteroaryl group, a cyano group, nitrile, isonitrile or a phosphino group, wherein the substitution refers to substitution by deuterium, F, Cl, Br, a C1 to C4 alkyl group, a C1 to C4 alkoxy group, a C3 to C6 cycloalkyl group, an amino group substituted by a C1 to C4 alkyl group, a cyano group, nitrile, isonitrile, or a phosphino group, and at least one of $R_3$ and $R_4$ is not hydrogen;

Z is independently selected from O, S, Se, C (R) 2, Si(R) 2, NR, BR or POR, wherein R is independently selected from a substituted or unsubstituted C1 to C10 alkyl group or alkoxy group, a substituted or unsubstituted C2 to C30 cycloalkyl group, a substituted or unsubstituted C6 to C30 aryl group, a substituted or unsubstituted C1 to C18 heteroaryl group; and wherein X—Y is a monoanionic bidentate ligand, wherein the sum of a and b equals to a valence state of the metal M.

Preferably, X—Y is a OO type and CN type ligand; and M is one of metals in Os, Ir, Pt, Pd, Ru, Rh or Au.

A preferable compound has a structure as shown in the following Formula II:

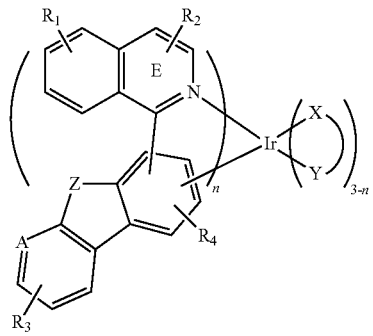

(II)

wherein n is a positive integer of 1 to 2, A is $CR_0$ or N, wherein $R_0$ to $R_4$ are independently selected from hydrogen, deuterium, a substituted or unsubstituted C1 to C8 alkyl group, a substituted or unsubstituted C1 to C8 heteroalkyl group, a substituted or unsubstituted C3 to C20 cycloalkyl group, a substituted or unsubstituted C1 to C8 aralkyl group, a substituted or unsubstituted C1 to C8 silyl group, or a C1 to C8 aryl group or heteroaryl group unsubstituted or substituted by a C1 to C4 alkyl group; and at least one of $R_3$ and $R_4$ is not hydrogen.

As a preferable compound, A is CH.

As a preferable compound, A is N.

As a preferable compound, an R3 substituent group is located adjacent to N.

As a preferable compound, R3 is D or an alkyl group containing at most 4 carbon atoms, particularly preferably an alkyl group at least containing one D, more particularly preferably CD3.

As a preferable compound, Z is O, S, NR or $C(R)_2$, wherein R is independently selected from a substituted or unsubstituted C1 to C8 alkyl group.

As a preferable compound, an $R_4$ substituent group is located adjacent to a metal-carbon bond.

As a preferable compound, an $R_4$ substituent group is located opposite to a metal-carbon bond.

As a preferable compound, X—Y is different from a left ligand.

As a preferable compound, X—Y is a 1,3-dione compound.

A preferable compound is the following compound:

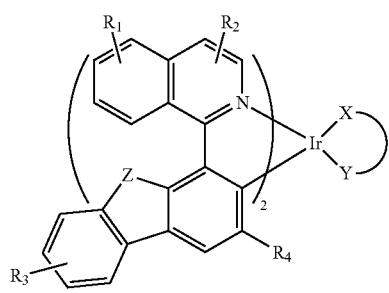

Formula III

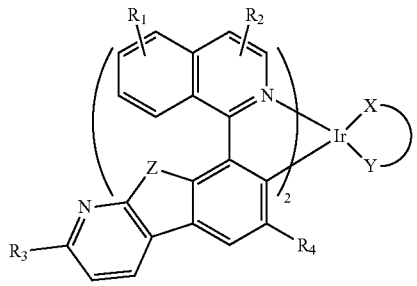

Formula IV

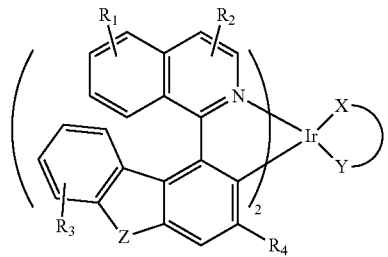

Formula V

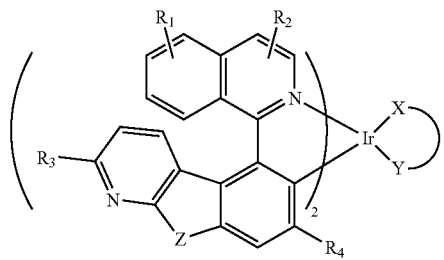

Formula VI

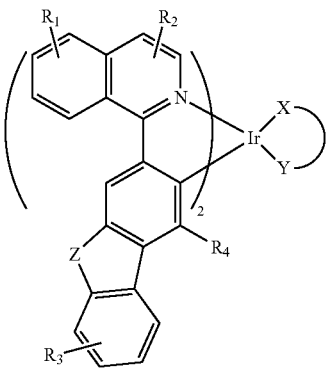

Formula VII

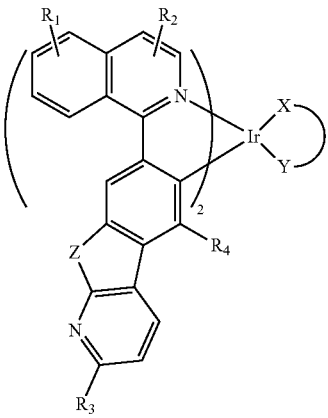

Formula VIII

Formula IX

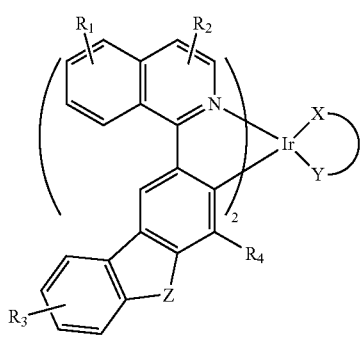

Formula X

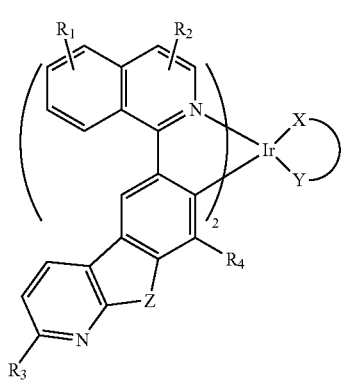

Formula XI

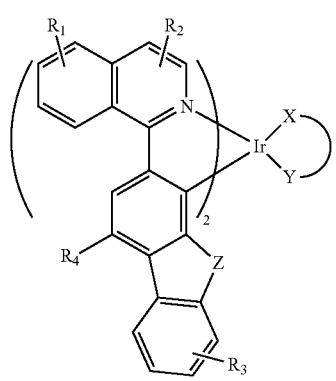

Formula XII

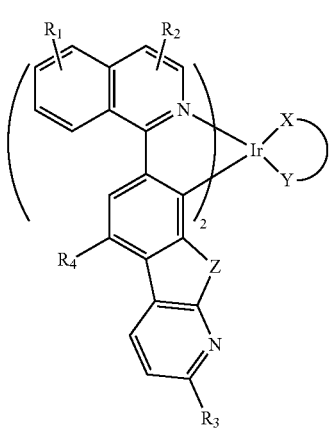

Formula XIII

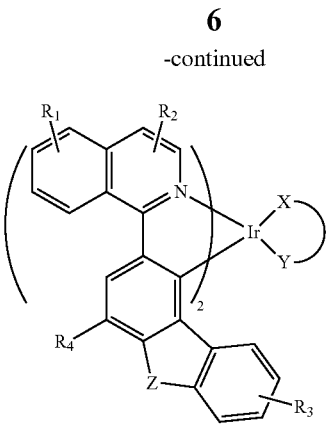

Formula XIV

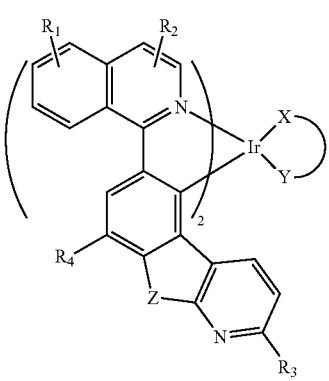

Preferably, Z is O, $R_1$ to $R_4$ are independently selected from hydrogen, deuterium, a substituted or unsubstituted C1 to C4 alkyl group, a substituted or unsubstituted C3 to C20 cycloalkyl group, a substituted or unsubstituted C1 to C8 aralkyl group, or a C1 to C8 aryl group or heteroaryl group unsubstituted or substituted by a C1 to C4 alkyl group; wherein at least one of $R_3$ and $R_4$ is not hydrogen.

$R_1$ to $R_4$ are independently selected from hydrogen, deuterium, a substituted or unsubstituted C1 to C4 alkyl group, a substituted or unsubstituted C3 to C20 cycloalkyl group, a C1 to C4 alkyl group substituted by a phenyl group, or a phenyl group substituted by a C1 to C4 alkyl group; wherein at least one of $R_3$ and $R_4$ is not hydrogen.

A preferable compound is the following compound:

CPD 1

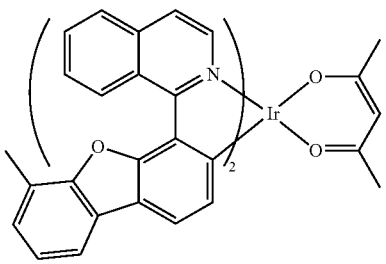

CPD 2
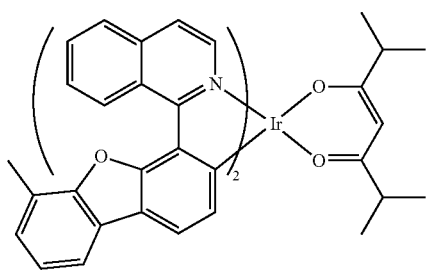
CPD 7
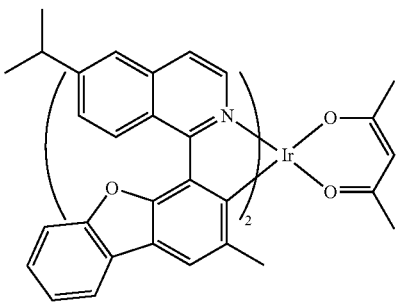
CPD 3
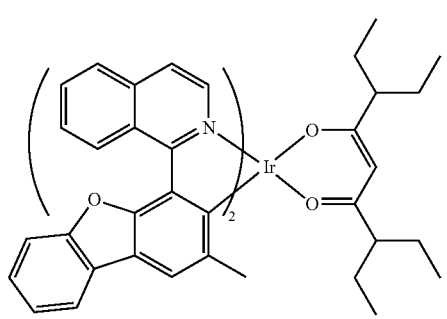
CPD 8
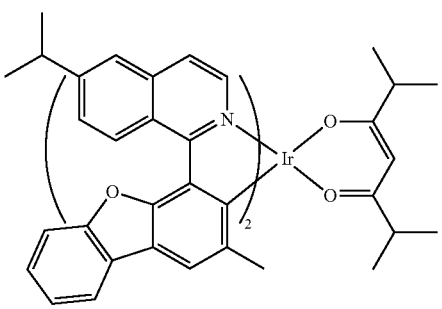
CPD 4
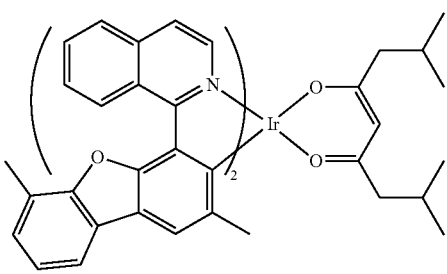
CPD 9
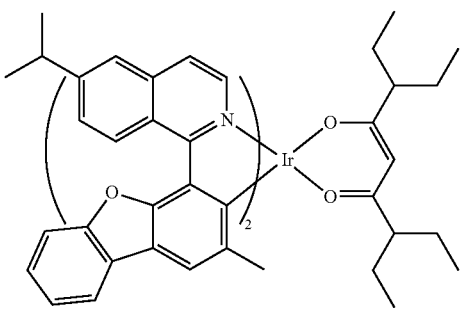
CPD 5
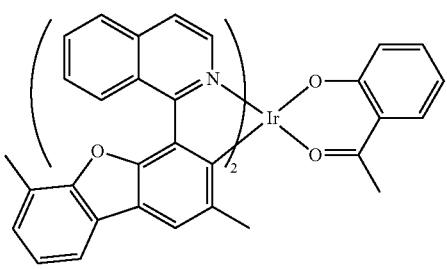
CPD 10
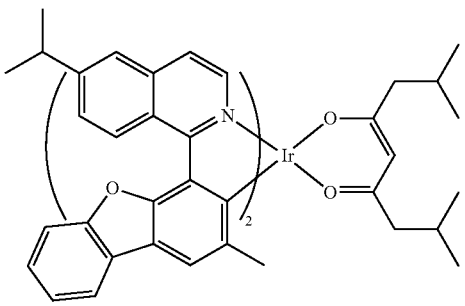
CPD 6
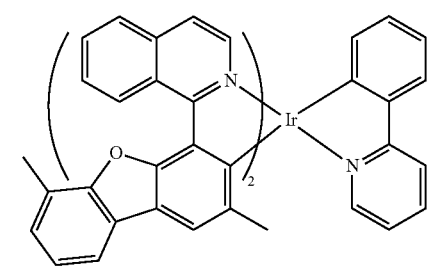
CPD 11
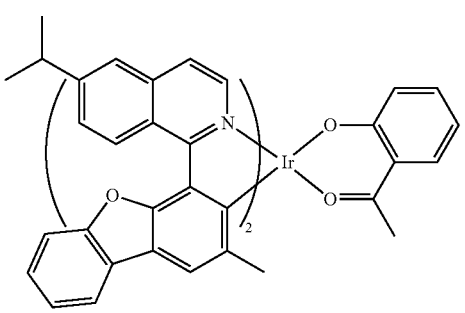

CPD 12
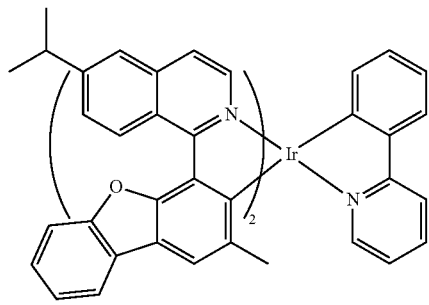
CPD 13
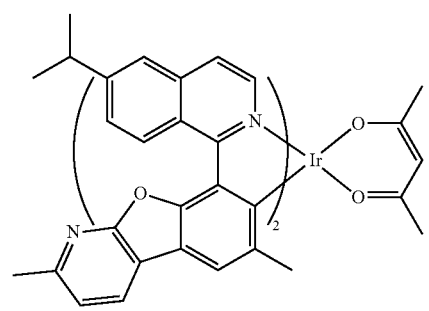
CPD 14
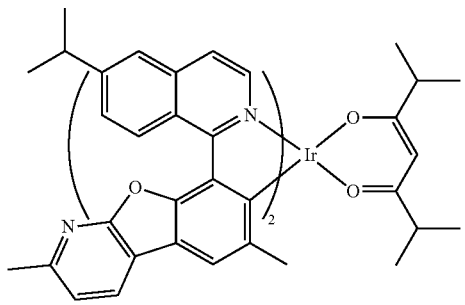
CPD 15
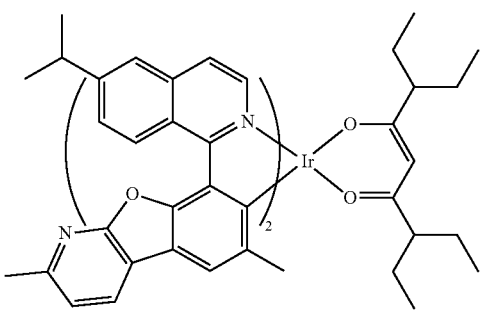
CPD 16
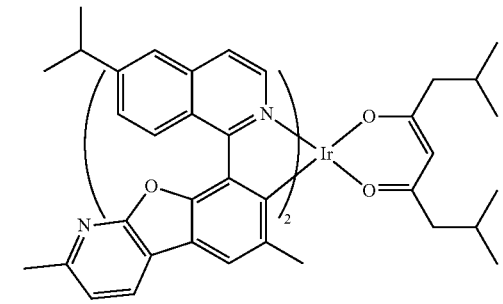
CPD 17
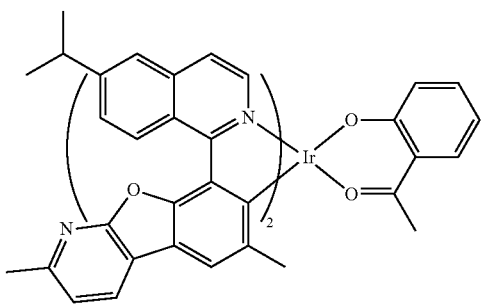
CPD 18
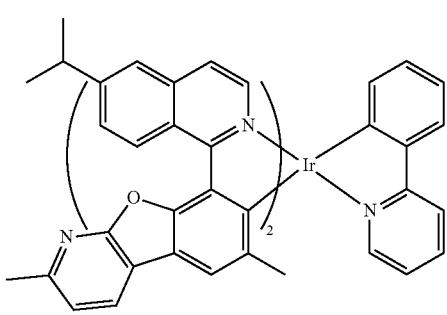
CPD 19
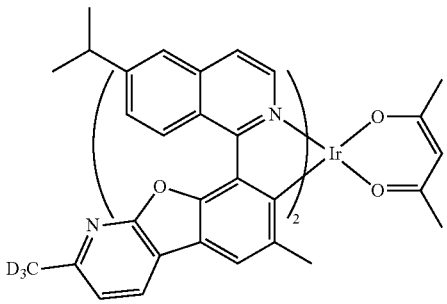
CPD 20
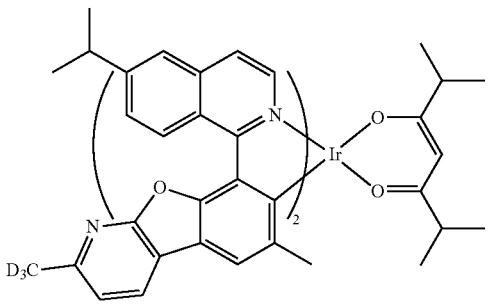
CPD 21
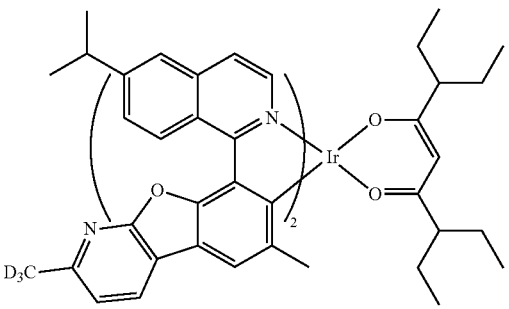

CPD 22
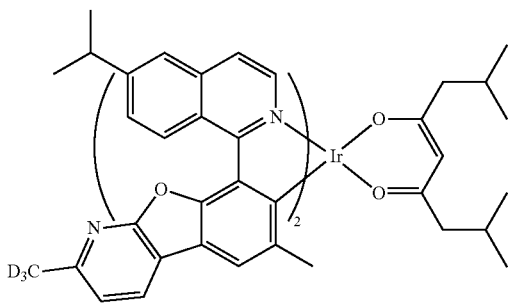
CPD 23
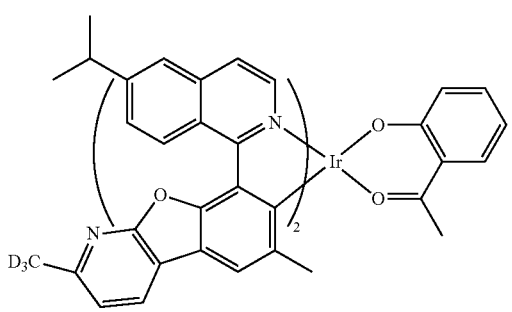
CPD 24
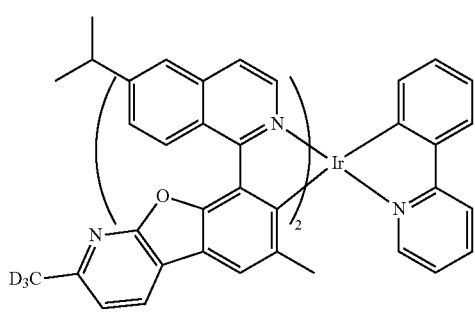
CPD 25
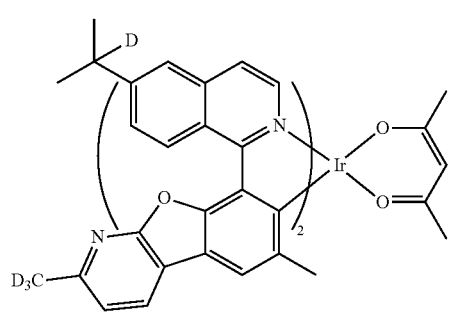
CPD 26
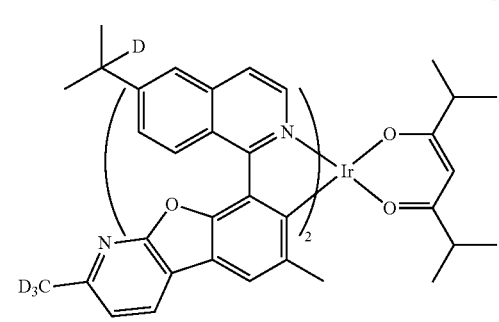
CPD 27
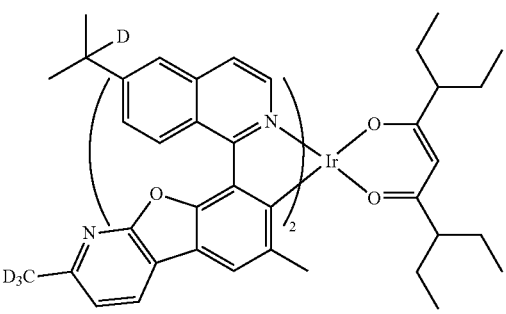
CPD 28
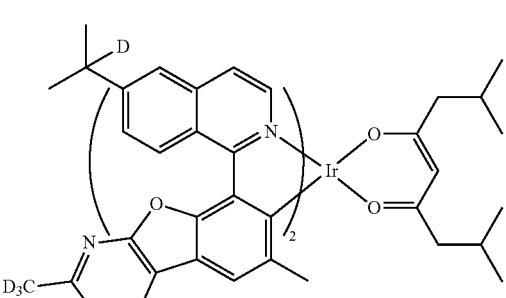
CPD 29
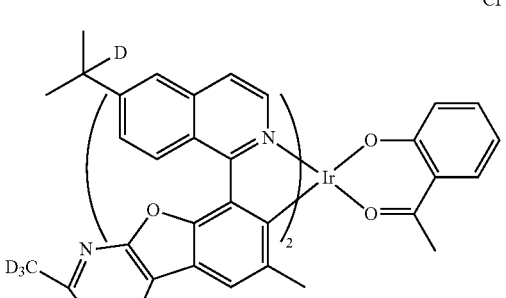
CPD 30
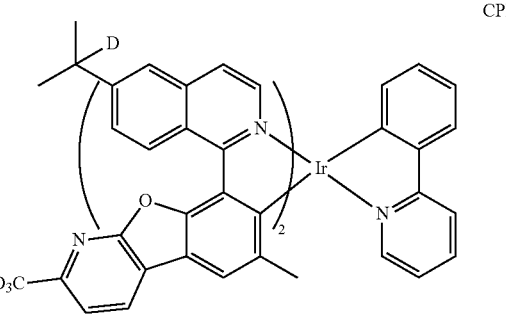
CPD 31

-continued
CPD 32
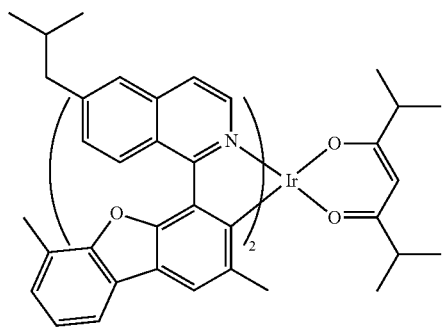
CPD 36
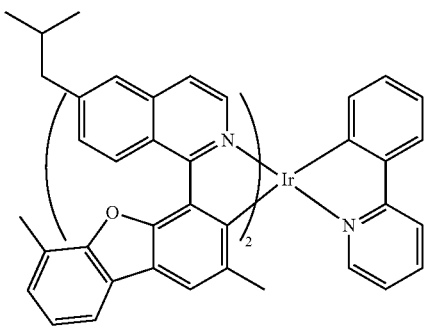
CPD 33
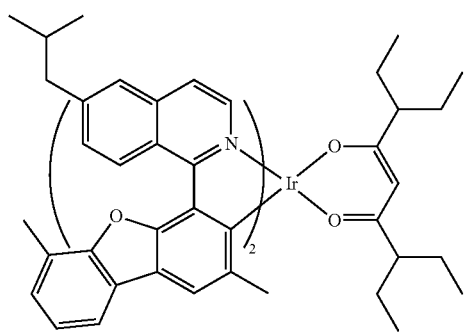
CPD 37
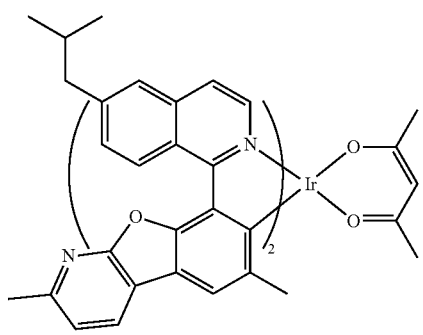
CPD 34
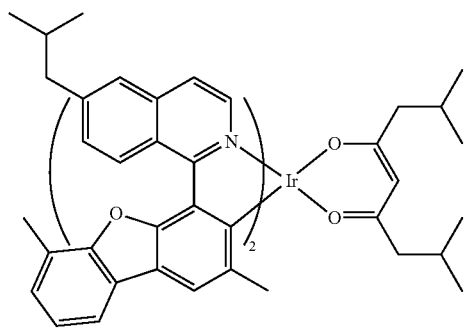
CPD 38
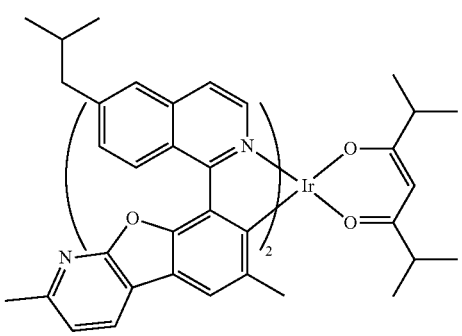
CPD 35
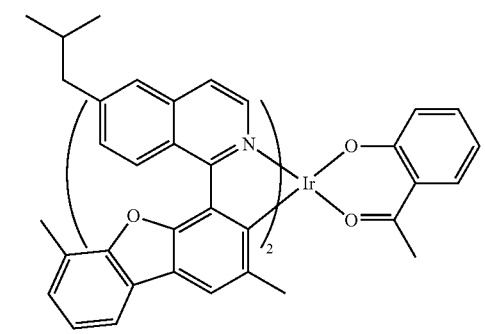
CPD 39
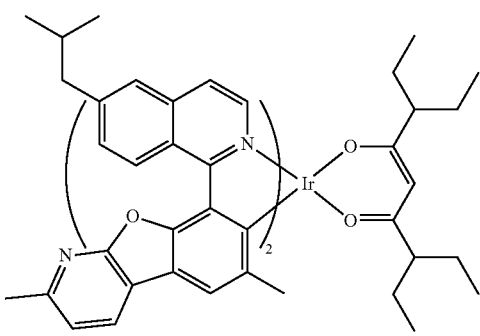

CPD 40
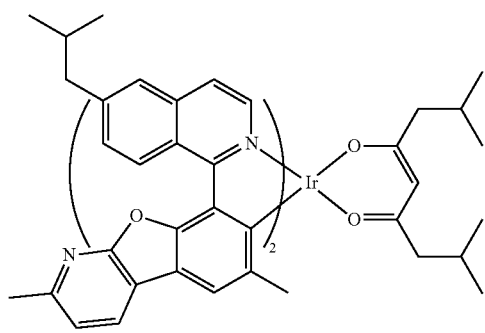
CPD 41
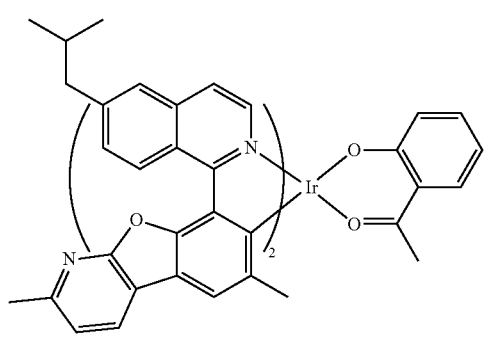
CPD 42
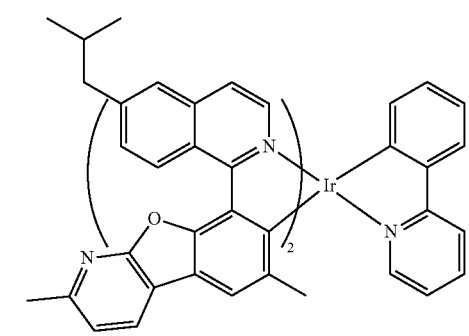
CPD 43
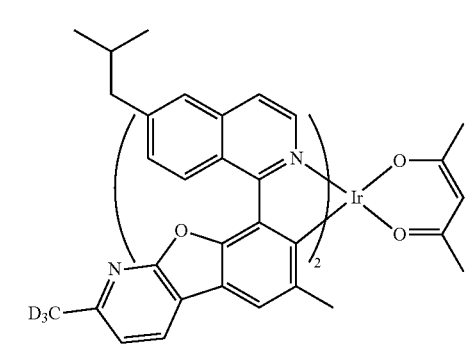
CPD 44
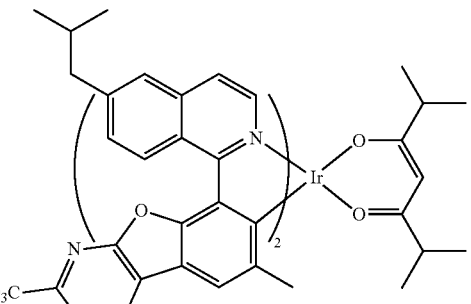
CPD 45
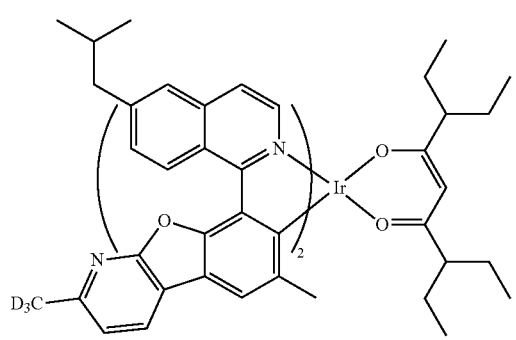
CPD 46
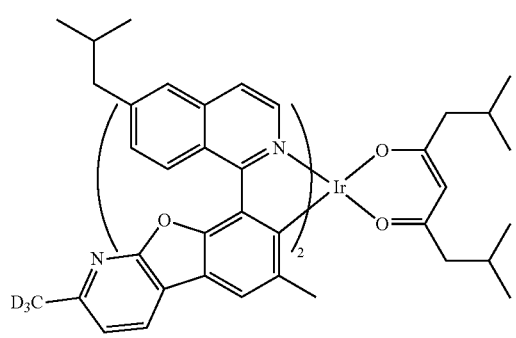
CPD 47
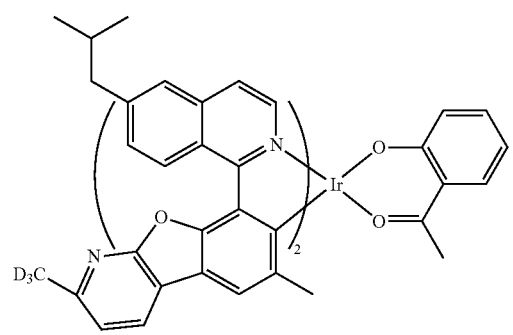

-continued
CPD 48
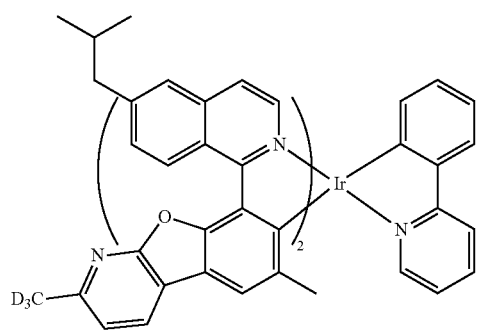
CPD 52
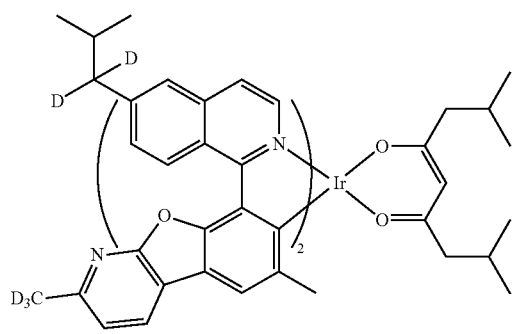
CPD 49
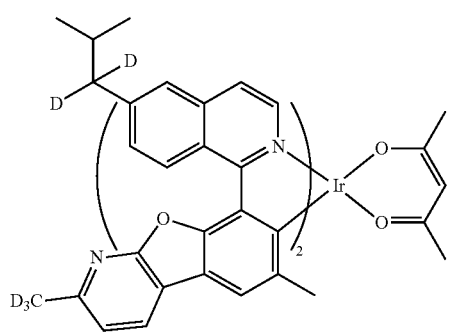
CPD 53
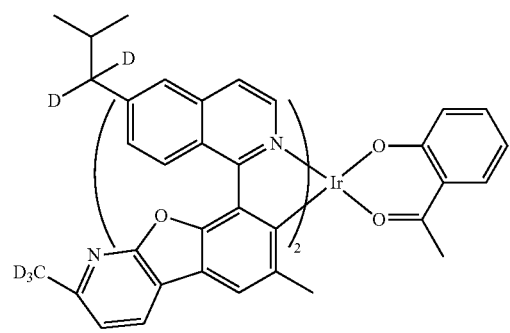
CPD 50
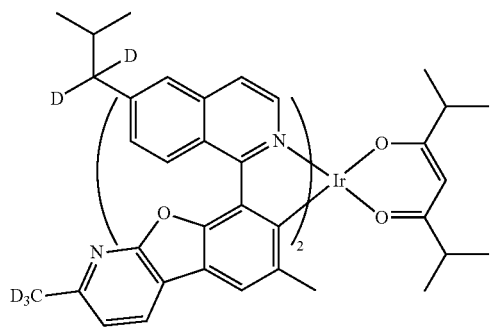
CPD 54
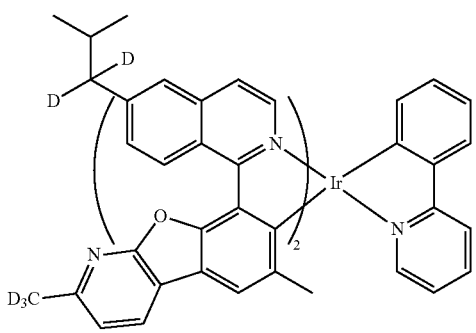
CPD 51
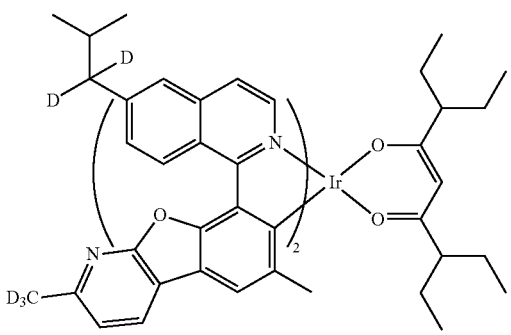
CPD 55
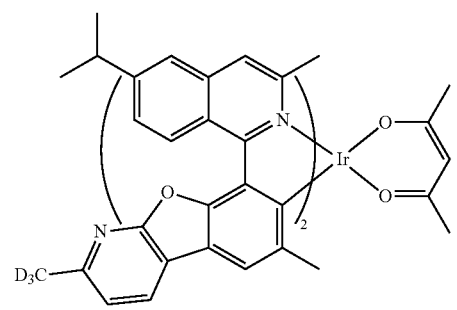

CPD 56
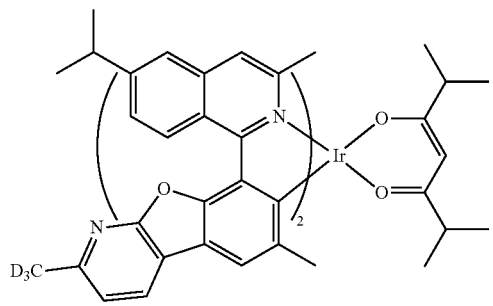
CPD 57
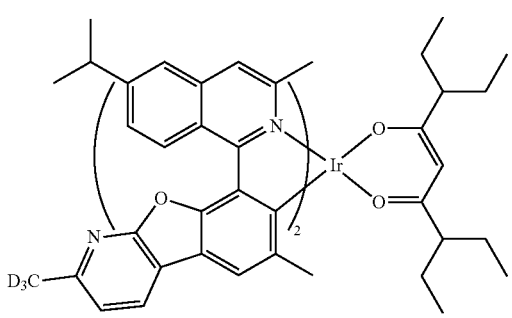
CPD 58
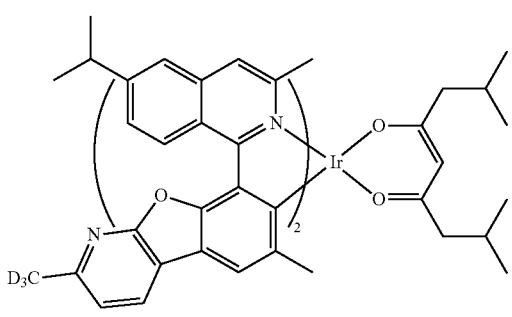
CPD 59
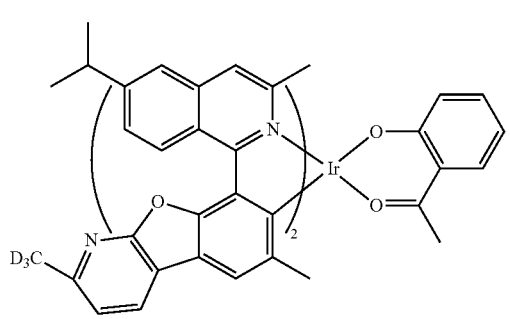
CPD 60
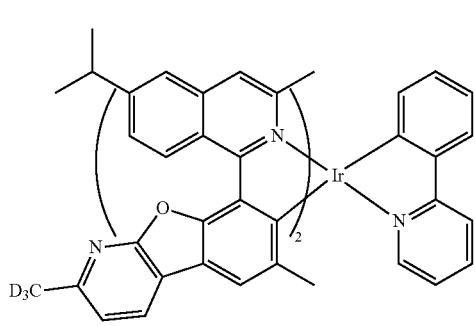
CPD 61
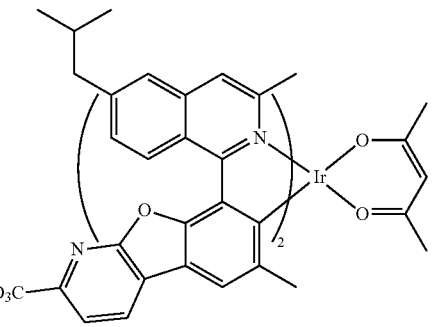
CPD 62
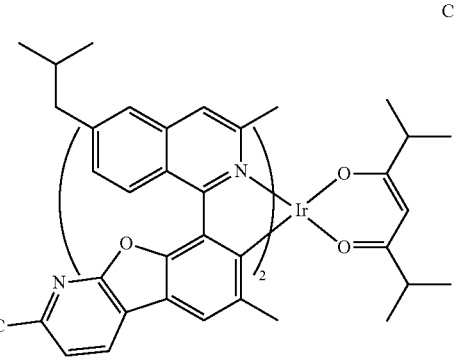
CPD 63
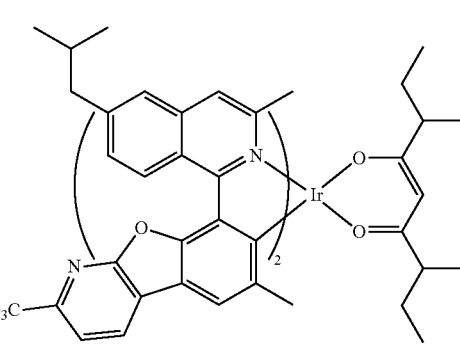
CPD 64
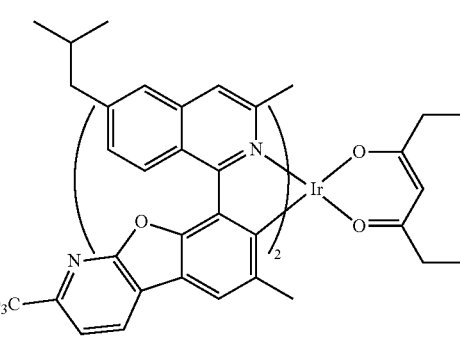

CPD 65
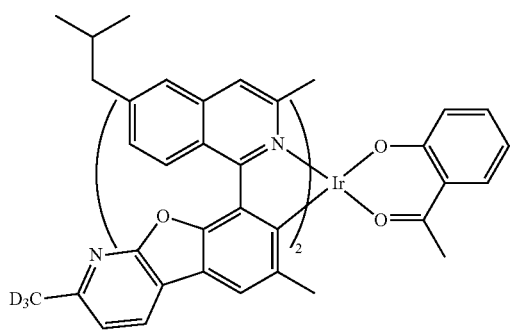
CPD 66
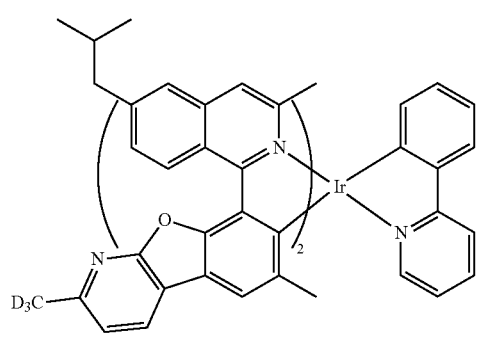
CPD 67
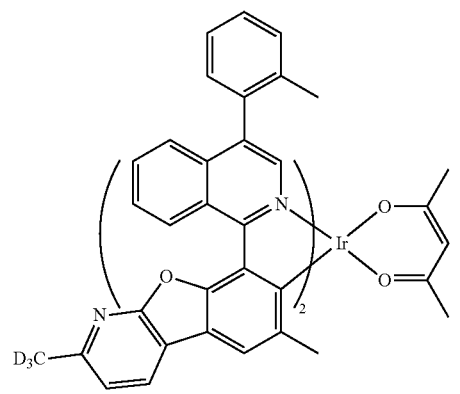
CPD 68
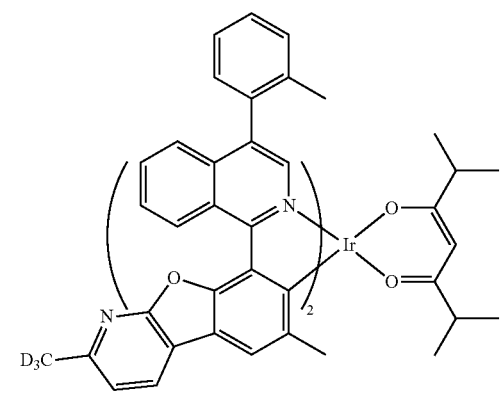
CPD 69
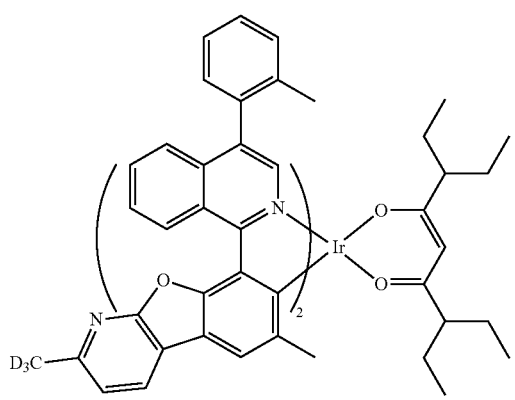
CPD 70
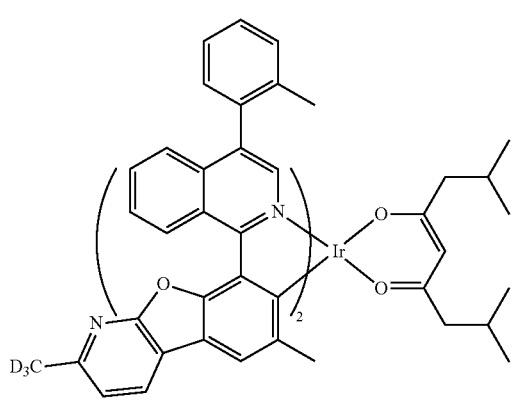
CPD 71
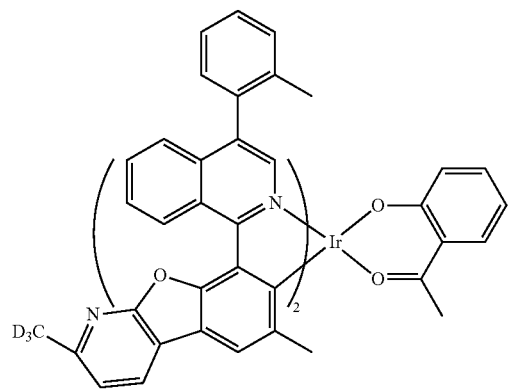
CPD 72
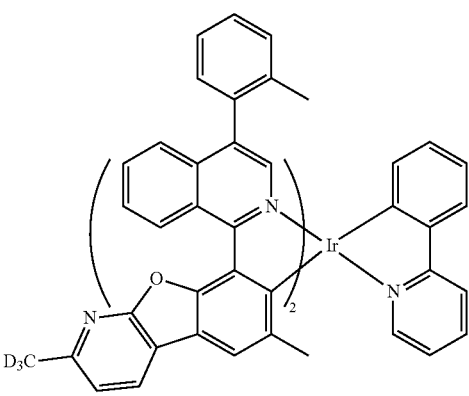

CPD 73
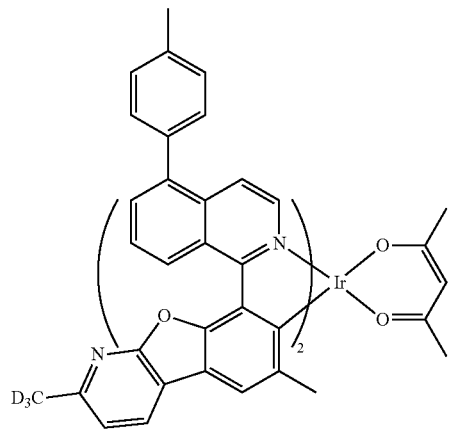
CPD 74
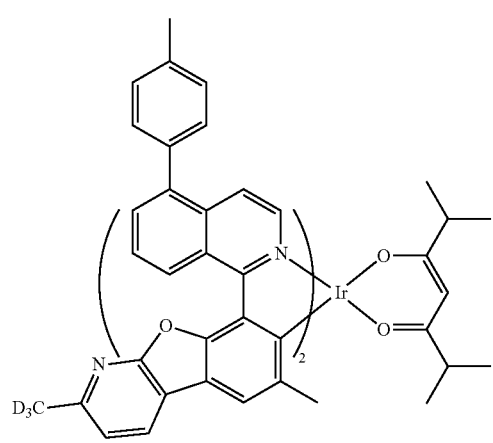
CPD 75
CPD 76
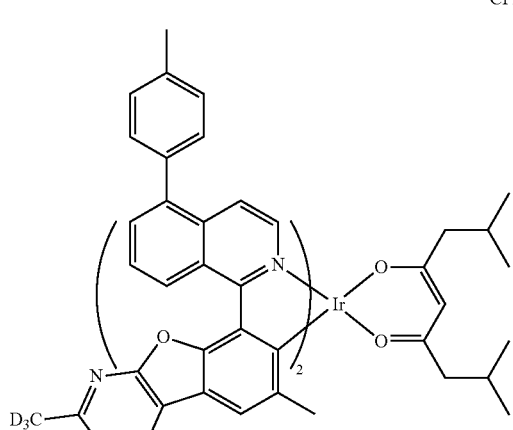
CPD 77
CPD 78
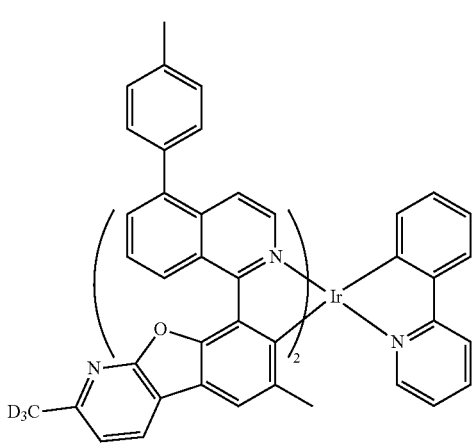
CPD 79
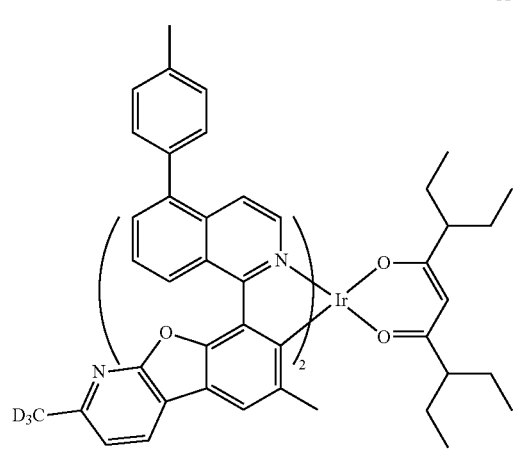

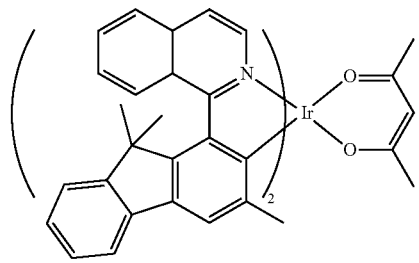

CPD 80

One objective of the present invention is further to provide an OLED phosphorescent material containing the above compound.

One objective of the present invention is further to provide an OLED device containing the above compound.

The material of the present invention has the advantages of low sublimation temperature, high light and electrochemical stability, high color saturation, high luminous efficiency, long lifetime of a device and the like. The material of the present invention used as a phosphorescent material can convert a triplet excited state into light, so that the luminous efficiency of the organic electroluminescence device can be improved, and the energy consumption is reduced.

DETAILED DESCRIPTION OF THE EMBODIMENTS

The following embodiments are merely for the convenience of understanding the technical invention and should not be construed as specifically limiting the present invention.

Raw materials, solvents and the like used in the compound synthesis of the present invention were purchased from suppliers known to those skilled in the art, such as Alfa and Acros.

Embodiment 1

Synthesis of Common Intermediates:

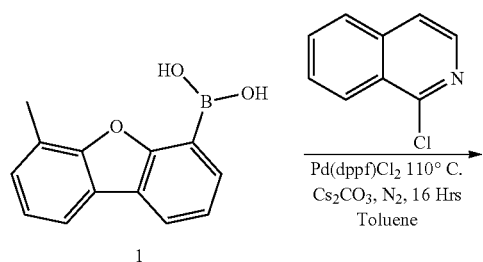

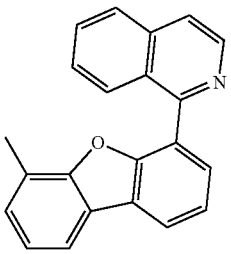

Synthesis of Compound 2:

Compound 1 (27.2 g, 0.12 mol, 1.2 eq), 1-chloroisoquinoline (16.3 g, 0.1 mol, 1.0 eq) and $Cs_2CO_3$ (97.5 g, 0.3 mol, 3.0 eq) and $Pd(dppf)Cl_2$ (3.655 g, 0.05 mol, 0.05 eq) were put into a flask. 1 L of anhydrous toluene was added. Under the protection effect of $N_2$, stirring back flow was performed at 110° C. for 16 h. Cooling was performed to reach a room temperature, and concentration was performed to remove an organic solvent. 1 L of dichloromethane and 1 L of water were added into residues, and stirring delamination was performed. An organic phase was sequentially washed by $H_2O$ (500 ml*3) and a saturated sodium chloride aqueous solution (500 ml*3). After drying by sodium sulphate, filtration was performed. An organic solvent was removed from filter liquor through concentration. Off white solids were obtained. The solids were purified through mashing by EtOH, and Compound 2 (24.33 g, yield: 78.7%) was obtained. Mass spectrum: 310.12 (M+H), 1HNMR: 8.42 (d, 1H), 7.92 (dd, 1H), 7.87 (dd, 1H), 7.71 (dd, 1H), 7.50-7.57 (m, 3H), 7.30 (dd, 1H), 6.99-7.20 (m, 4H), 2.35 (S,3H).

Synthesis of Compound 3:

Compound 2 (18.5 g, 0.06 mol, 3.0 eq) and $IrCl_3 \cdot 3H_2O$ (7.04 g, 0.02 mol, 1.0 eq) were put into a flask. 2-ethoxyethanol (133.4 ml) and deionized water (66.7 ml) were added. A mixed solution was subjected to stirring back flow at 110° C. for 16 h under the protection effect of $N_2$. After the cooling to a room temperature, filtration was performed. Filter residues were sequentially dried by methanol (100 ml*3) and n-hexane (100 ml*3) to obtain Compound 3 (9.38 g, 55.4%). The obtained compound was directly used for a next step without purification.

Synthesis of CPD 1:

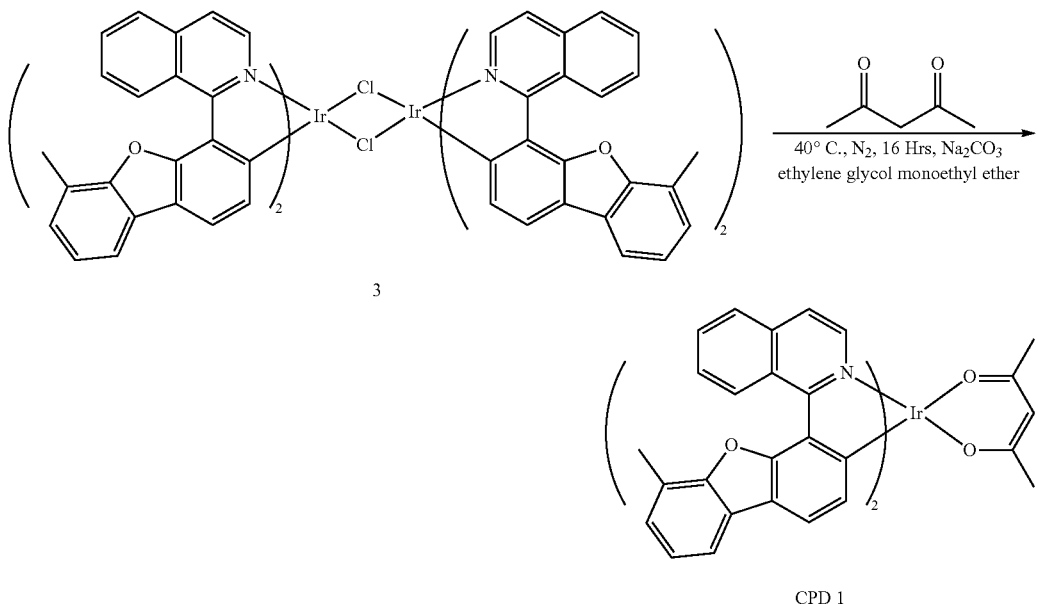

Compound 3 (5.08 g, 3 mmol, 1.0 eq) was dissolved in ethylene glycol monoethyl ether (30 ml). Anhydrous sodium carbonate (6.36 g, 60 mmol, 20.0 eq) and acetylacetone (3 g, 30 mmol, 10.0 eq) were sequentially added. After the addition was completed, under the protection effect of $N_2$, a mixed solution was stirred for 16 h at 40° C., and was cooled to the room temperature. 2 g of diatomite and 300 ml of dichloromethane were added into reaction liquid. Then, the mixed solution was filtered through diatomite and silica gel. The dichloromethane was removed from the obtained filter liquid in a spinning manner. Additionally, 40 ml of isopropanol was added into a residual solution. Red solids were separated out. Filtration was performed. The solids were subjected to pulping treatment through ethyl acetate to obtain a target compound CPD 1 (2.56 g, 46.8%). 2.56 g of CPD 1 crude products were sublimated and purified to obtain sublimated pure CPD 1 (2 g, 78.1%). Mass spectrum: 909.23 (M+H)

Synthesis of CPD 3:

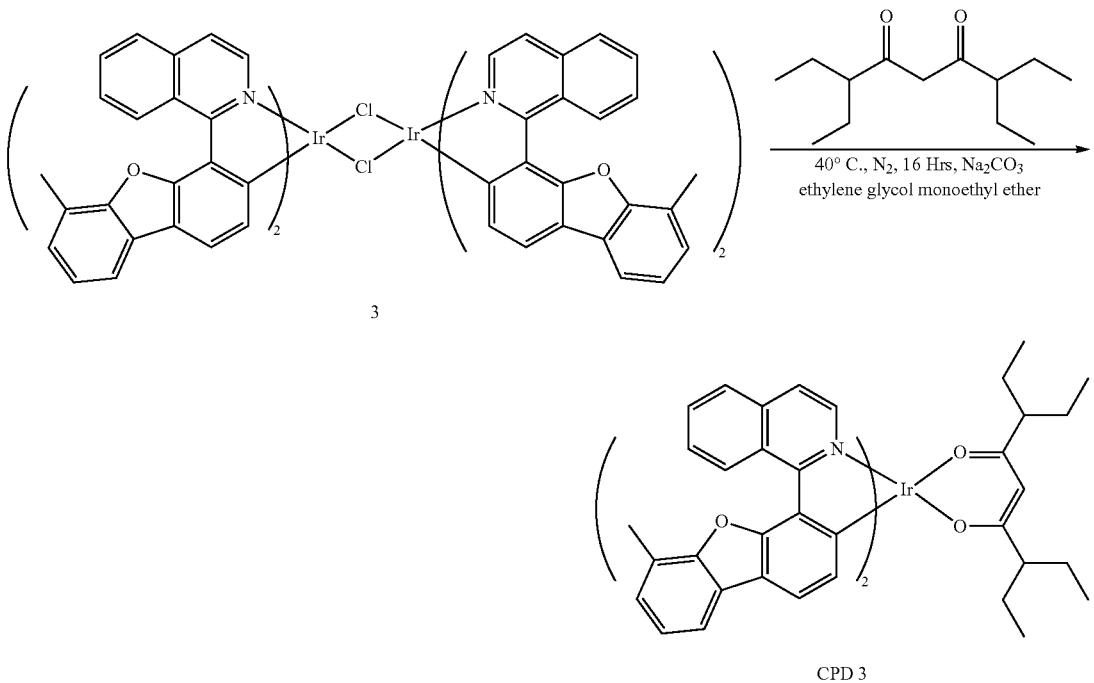

Compound 3 (5.08 g, 3 mmol, 1.0 eq) was dissolved in ethylene glycol monoethyl ether (30 ml). Anhydrous sodium carbonate (6.36 g, 60 mmol, 20.0 eq) and 3,7-diethyl-4,6-nonanedione (6.36 g, 30 mmol, 10.0 eq) were sequentially added. After the addition was completed, under the protection effect of $N_2$, a mixed solution was stirred for 16 h at 40° C., and was cooled to the room temperature. 2 g of diatomite and 300 ml of dichloromethane were added into reaction liquid. Then, the mixed solution was filtered through diatomite and silica gel. The dichloromethane was removed from the obtained filter liquid in a spinning manner. Additionally, 40 ml of isopropanol was added into a residual solution. Red solids were separated out. Filtration was performed. The solids were subjected to pulping treatment through ethyl acetate to obtain a target compound CPD 3 (2.69 g, 43.9%). 2.69 g of CPD 3 crude products were sublimated and purified to obtain sublimated pure CPD 3 (1.78 g, 66.2%). Mass spectrum: 1021.36 (M+H)

Embodiment 2

Synthesis of Common Intermediates:

was performed at 110° C. for 16 h. Cooling was performed to reach a room temperature, and concentration was performed to remove an organic solvent. 1 L of dichloromethane and 1 L of water were added into residues, and stirring delamination was performed. An organic phase was sequentially washed by $H_2O$ (500 ml*3) and a saturated sodium chloride aqueous solution (500 ml*3). After drying by sodium sulphate, filtration was performed. An organic solvent was removed from filter liquor through concentration. Off white solids were obtained. The solids were subjected to column chromatography purification by ethyl acetate/petroleum ether. Compound 5 (28.12 g, yield: 76.8%) was obtained. Mass spectrum: 367.18 (M+H), 1HNMR: 8.4 (d,1H),7.81 (dd, 1H), 7.74 (dd, 1H), 7.71 (s, 1H), 7.50 (s, 1H), 7.27-7.36 (m, 3H), 7.1 (d,1H),3.12 (q,1H),2.55 (s, 3H), 2.35 (s, 3H), 1.29 (d, 6H).

Synthesis of Compound 6:

Compound 5 (22 g, 0.06 mol, 3.0 eq) and $IrCl_3 \cdot 3H_2O$ (7.04 g, 0.02 mol, 1.0 eq) were put into a flask. 2-ethoxyethanol (133.4 ml) and deionized water (66.7 ml) were added. A mixed solution was subjected to stirring back flow

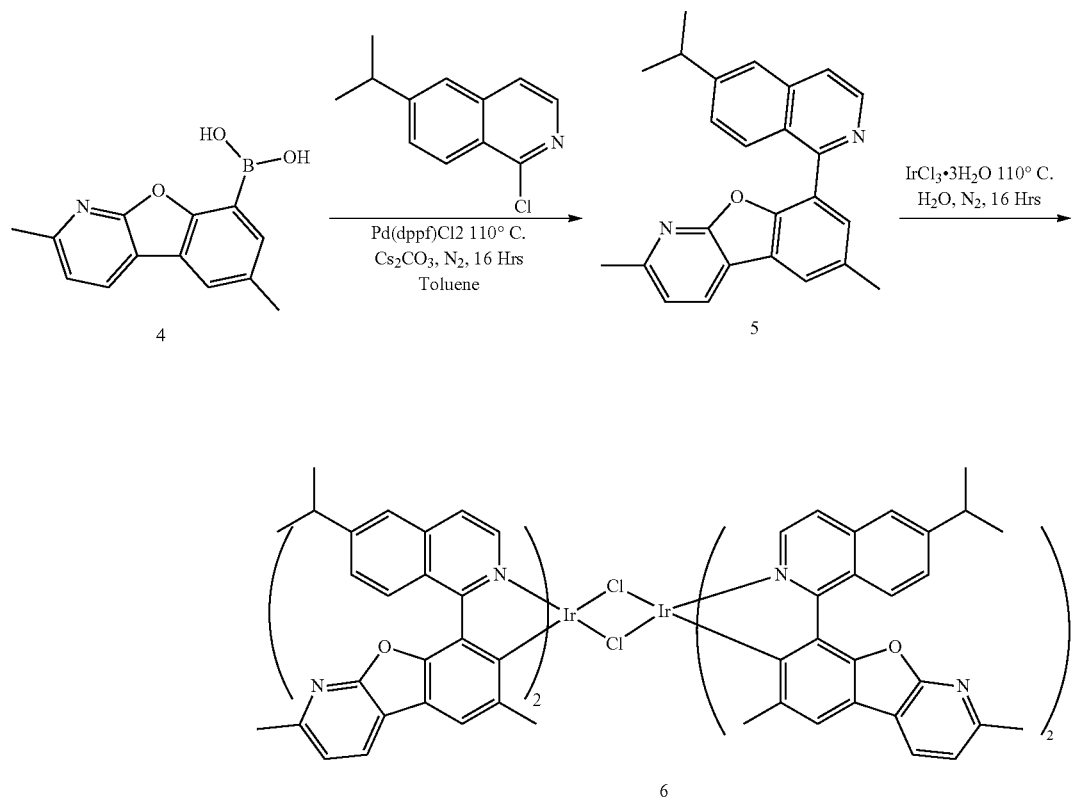

Synthesis of Compound 5:

Compound 4 (28.92 g, 0.12 mol, 1.2 eq), 1-chloro-6-isopropylisoquinoline (20.5 g, 0.1 mol, 1.0 eq) and $Cs_2CO_3$ (97.5 g, 0.3 mol, 3.0 eq) and Pd(dppf)$Cl_2$ (3.655 g, 0.05 mol, 0.05 eq) were put into a flask. 1 L of anhydrous toluene was added. Under the protection effect of $N_2$, stirring back flow at 110° C. for 16 h under the protection effect of $N_2$. After the cooling to a room temperature, filtration was performed. Filter residues were sequentially dried by methanol (100 ml*3) and n-hexane (100 ml*3) to obtain Compound 6 (9.86 g, 51.3%). The obtained compound was directly used for a next step without purification.

Synthesis of CPD 13:

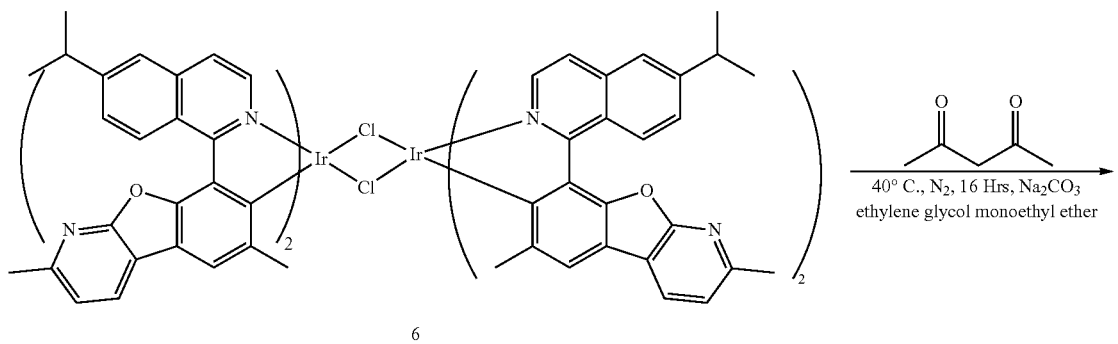

CPD 13

Compound 6 (5.76 g, 3 mmol, 1.0 eq) was dissolved in ethylene glycol monoethyl ether (30 ml). Anhydrous sodium carbonate (6.36 g, 60 mmol, 20.0 eq) and acetylacetone (3 g, 30 mmol, 10.0 eq) were sequentially added. After the addition was completed, under the protection effect of $N_2$, a mixed solution was stirred for 16 h at 40° C., and was cooled to the room temperature. 2 g of diatomite and 300 ml of dichloromethane were added into reaction liquid. Then, the mixed solution was filtered through diatomite and silica gel. The dichloromethane was removed from the obtained filter liquid in a spinning manner. Additionally, 40 ml of isopropanol was added into a residual solution. Red solids were separated out. Filtration was performed. The solids were subjected to pulping treatment through ethyl acetate to obtain a target compound CPD 13 (2.33 g, 38%). 2.33 g of CPD 13 crude products were sublimated and purified to obtain sublimated pure CPD 13 (1.72 g, 73.8%). Mass spectrum: 1023.34 (M+H)

Synthesis of CPD 16:

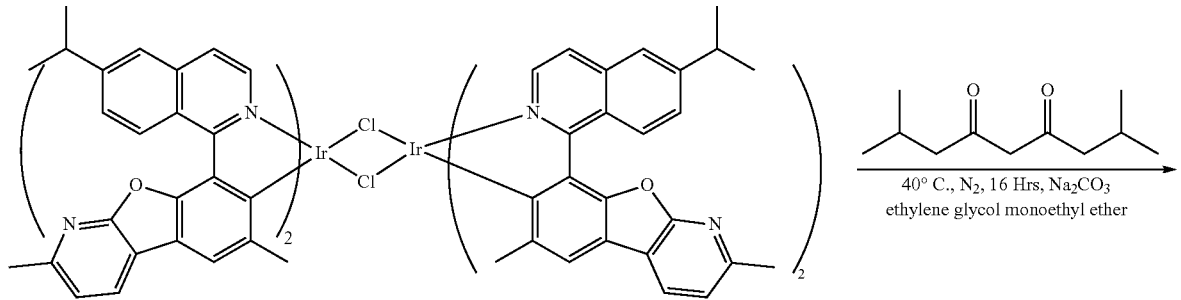

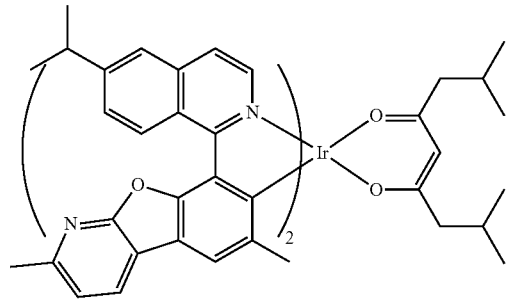

CPD 16

Compound 6 (5.76 g, 3 mmol, 1.0 eq) was dissolved in ethylene glycol monoethyl ether (30 ml). Anhydrous sodium carbonate (6.36 g, 60 mmol, 20.0 eq) and 2,8-dimethyl-4,6-nonanedione (6.36 g, 30 mmol, 10.0 eq) were sequentially added. After the addition was completed, under the protection effect of $N_2$, a mixed solution was stirred for 16 h at 40° C., and was cooled to the room temperature. 2 g of diatomite and 300 ml of dichloromethane were added into reaction liquid. Then, the mixed solution was filtered through diatomite and silica gel. The dichloromethane was removed from the obtained filter liquid in a spinning manner. Additionally, 40 ml of isopropanol was added into a residual solution. Red solids were separated out. Filtration was performed. The solids were subjected to pulping treatment through ethyl acetate to obtain a target compound CPD 16 (2.12 g, 32%). 2.12 g of CPD 16 crude products were sublimated and purified to obtain sublimated pure CPD 16 (1.65 g, 77.8%). Mass spectrum: 1107.43 (M+H)

Synthesis of CPD 17:

Compound 6 (5.76 g, 3 mmol, 1.0 eq) was dissolved in ethylene glycol monoethyl ether (30 ml). Anhydrous sodium carbonate (6.36 g, 60 mmol, 20.0 eq) and 2-acetylphenol (4.08 g, 30 mmol, 10.0 eq) were sequentially added. After the addition was completed, under the protection effect of $N_2$, a mixed solution was stirred for 16 h at 40° C., and was cooled to the room temperature. 2 g of diatomite and 300 ml of dichloromethane were added into reaction liquid. Then, the mixed solution was filtered through diatomite and silica gel. The dichloromethane was removed from the obtained filter liquid in a spinning manner. Additionally, 40 ml of isopropanol was added into a residual solution. Red solids were separated out. Filtration was performed. The solids were subjected to column chromatography separation to obtain a target compound CPD 17 (2.58 g, 41%). 2.58 g of CPD 17 crude products were sublimated and purified to obtain sublimated pure CPD 17 (1.88 g, 73.1%). Mass spectrum: 1059.34 (M+H)

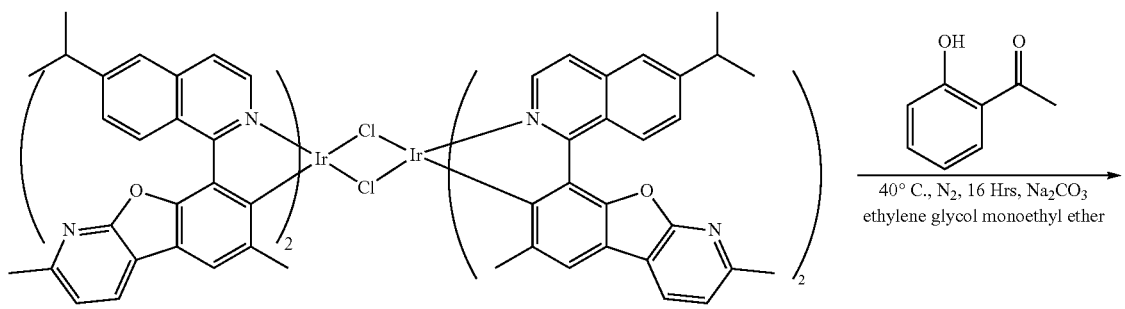

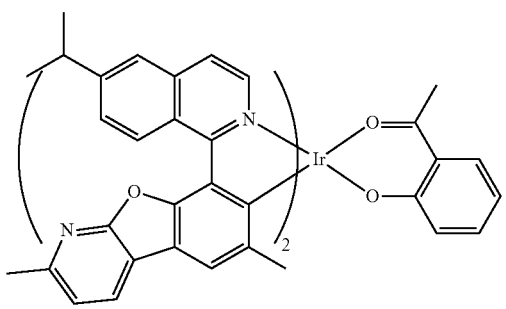

CPD 17

Synthesis of CPD 18:

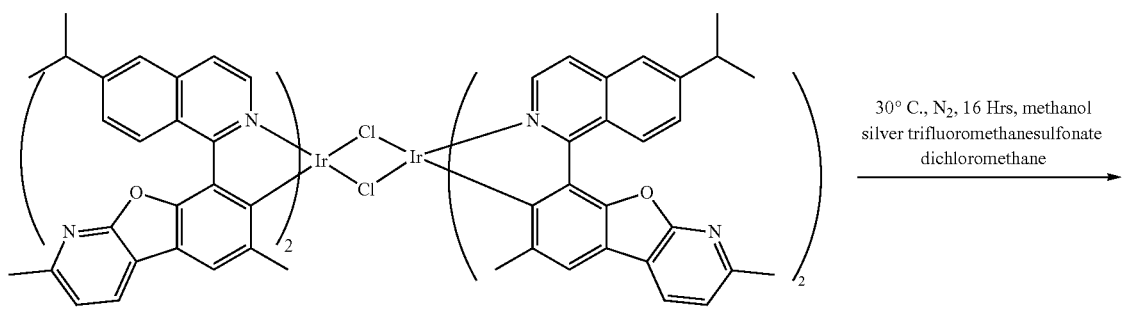

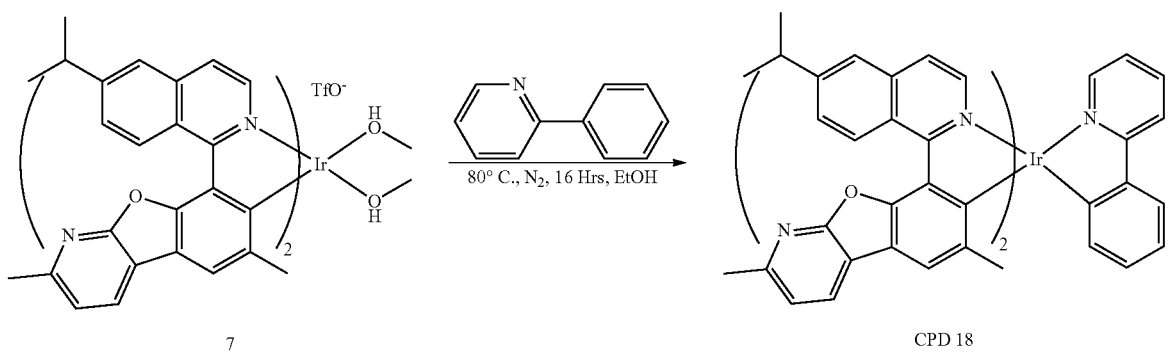

Synthesis of Compound 7:

Compound 6 (19.2 g, 0.01 mol, 1.0 eq) was dissolved in DCM (500 ml). Silver trifluoromethanesulfonate (5.25 g, 0.02 mol, 2.0 eq) and methanol (50 mmol) were sequentially added into reaction liquid. After the addition was completed, under the protection effect of $N_2$, a mixed solution was stirred for 16 h at 30° C. Insoluble solids were removed from reaction liquid through silica gel and diatomite. The filter liquid dried in a spinning manner. Compound 7 (22 g) was obtained. The obtained product was directly used for a next step of reaction.

Synthesis of CPD 18:

Compound 7 (3.41 g, 3 mmol, 1.0 eq) and 2-phenylpyridine (1.4 g, 9 mmol, 3.0 eq) were dissolved in absolute ethanol (100 ml). After the addition was completed, under the protection effect of $N_2$, a mixed solution was subjected to back flow stirring for 16 h at 80° C., and was cooled to the room temperature. Filtration was performed. Filter residues were washed for 3 times sequentially by methanol and n-hexane. Drying was performed to obtain a target compound CPD 18 (1.68 g, 52%). 1.68 g of CPD 18 crude products were sublimated and purified to obtain sublimated pure CPD 18 (1.24 g, 73.8%). Mass spectrum: 1078.36 (M+H)

Synthesis of CPD 24:

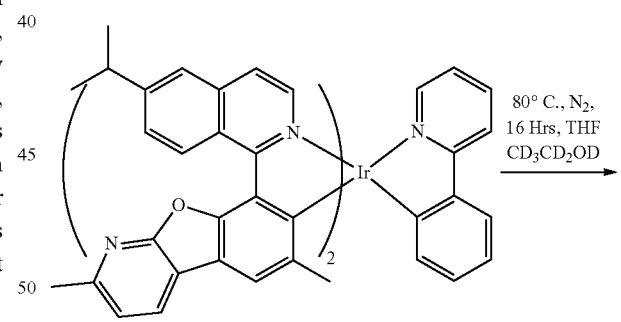

CPD 18

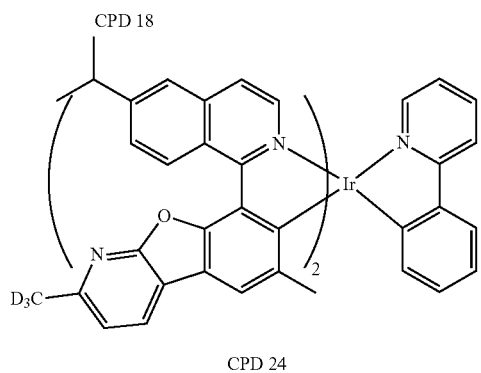

CPD 24

Compound CPD 18 (2.15 g, 2 mmol, 1.0 eq) and Ethanol-d6 (100 ml) were dissolved in anhydrous THF (50 ml). After the addition was completed, under the protection effect of $N_2$, a mixed solution was subjected to back flow stirring for 16 h at 80° C., and was cooled to the room temperature. Filtration was performed. Filter residues were washed for 3 times sequentially by methanol and n-hexane. Drying was performed to obtain a target compound CPD 24 (2.15 g, 99%). 2.15 g of CPD 24 crude products were sublimated and purified to obtain sublimated pure CPD 24 (1.54 g, 71.6%). Mass spectrum: 1078.36 (M+H)

Synthesis of CPD 19:

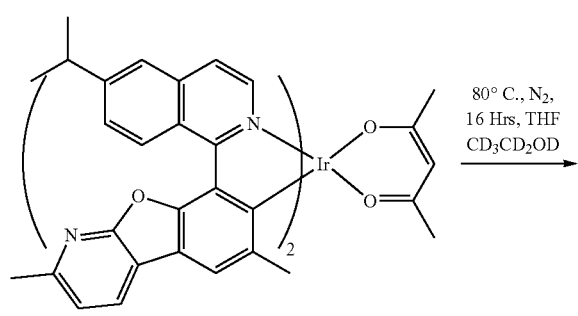

CPD 13

$\xrightarrow{\text{80° C., N}_2, \text{16 Hrs, THF} \atop \text{CD}_3\text{CD}_2\text{OD}}$

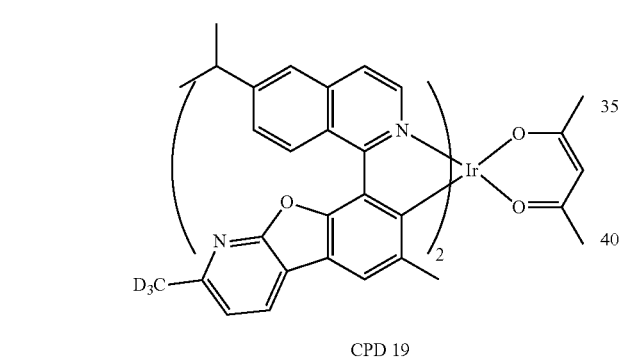

CPD 19

A synthesis method was the same as that of CPD 24, and a target compound CPD 19 (1.88 g, 99%) was obtained. 1.88 g of CPD 19 crude products were sublimated and purified to obtain sublimated pure CPD 19 (1.42 g, 75.5%). Mass spectrum: 1028.38 (M+H)

Synthesis of CPD 22:

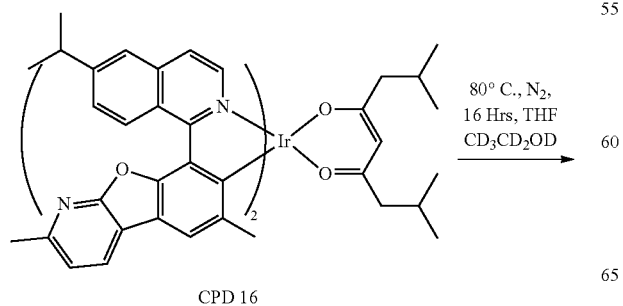

CPD 16

$\xrightarrow{\text{80° C., N}_2, \text{16 Hrs, THF} \atop \text{CD}_3\text{CD}_2\text{OD}}$

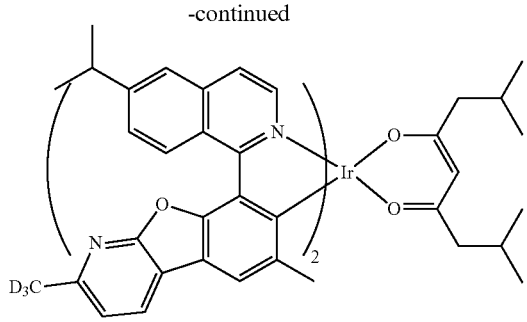

CPD 22

A synthesis method was the same as that of CPD 24, and a target compound CPD 22 (2.35 g, 99%) was obtained. 2.35 g of CPD 22 crude products were sublimated and purified to obtain sublimated pure CPD 22 (1.64 g, 69.9%). Mass spectrum: 1113.47 (M+H)

Synthesis of CPD 23:

CPD 17

$\xrightarrow{\text{80° C., N}_2, \text{16 Hrs, THF} \atop \text{CD}_3\text{CD}_2\text{OD}}$

CPD 23

A synthesis method was the same as that of CPD 24, and a target compound CPD 23 (2.52 g, 99%) was obtained. 2.52 g of CPD 23 crude products were sublimated and purified to obtain sublimated pure CPD 23 (1.92 g, 76.2%). Mass spectrum: 1065.38 (M+H)

Embodiment 3

Synthesis of CPD 79:

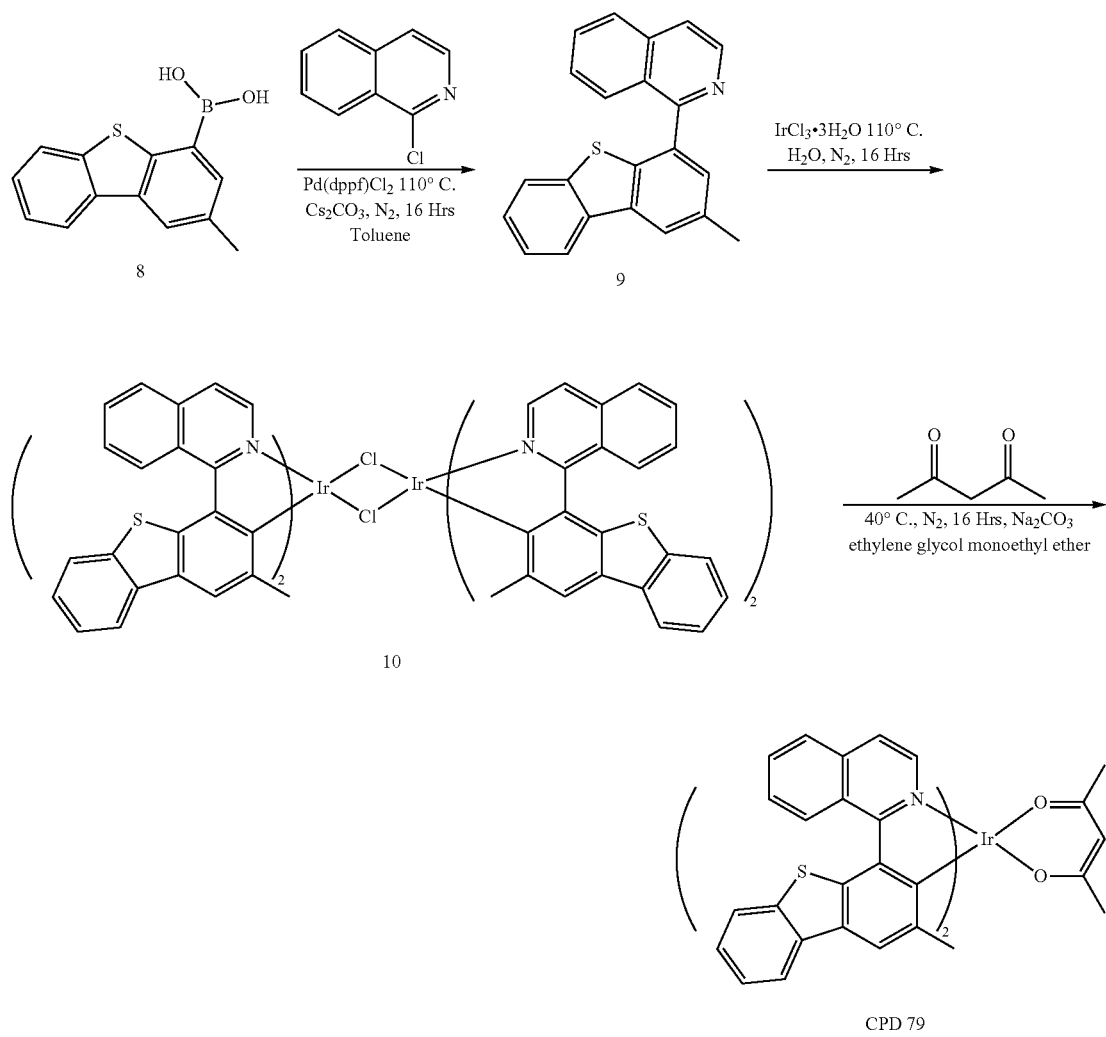

CPD 79

Synthesis of Compound 9:

Compound 8 (29.1 g, 0.12 mol, 1.2 eq), 1-chloroisoquinoline (16.3 g, 0.1 mol, 1.0 eq) and $Cs_2CO_3$ (97.5 g, 0.3 mol, 3.0 eq) and $Pd(dppf)Cl_2$ (3.655 g, 0.05 mol, 0.05 eq) were put into a flask. 1 L of anhydrous toluene was added. Under the protection effect of $N_2$, stirring back flow was performed at 110° C. for 16 h. Cooling was performed to reach a room temperature, and concentration was performed to remove an organic solvent. 1 L of dichloromethane and 1 L of water were added into residues, and stirring delamination was performed. An organic phase was sequentially washed by $H_2O$ (500 ml*3) and a saturated sodium chloride aqueous solution (500 ml*3). After drying by sodium sulphate, filtration was performed. An organic solvent was removed from filter liquor through concentration. Off white solids were obtained. The solids were separated through column chromatography, and Compound 9 (23.41 g, yield: 72.1%) was obtained. Mass spectrum: 326.1 (M+H), 1HNMR: 8.51 (d, 1H), 7.71-7.82 (m, 5H), 7.50-7.60 (m, 3H), 7.30-7.4 (m, 2H), 7.10 (d, 1H), 2.21 (s, 3H).

Synthesis of Compound 10:

Compound 9 (19.5 g, 0.06 mol, 3.0 eq) and $IrCl_3$ $3H_2O$ (7.04 g, 0.02 mol, 1.0 eq) were put into a flask. 2-ethoxyethanol (133.4 ml) and deionized water (66.7 ml) were added. A mixed solution was subjected to stirring back flow at 110° C. for 16 h under the protection effect of $N_2$. After the cooling to a room temperature, filtration was performed. Filter residues were sequentially dried by methanol (100 ml*3) and n-hexane (100 ml*3) to obtain Compound 3 (8.54 g, 48.6%). The obtained compound was directly used for a next step without purification.

Synthesis of CPD 79:

Synthesis and purification methods were the same as those of CPD 1, and a target compound CPD 79 (3.26 g, 46.8%) was obtained. 3.26 g of CPD 79 crude products were sublimated and purified to obtain sublimated pure CPD 79 (2.33 g, 71.6%). Mass spectrum: 941.18 (M+H)

Embodiment 4

Synthesis of CPD 80:

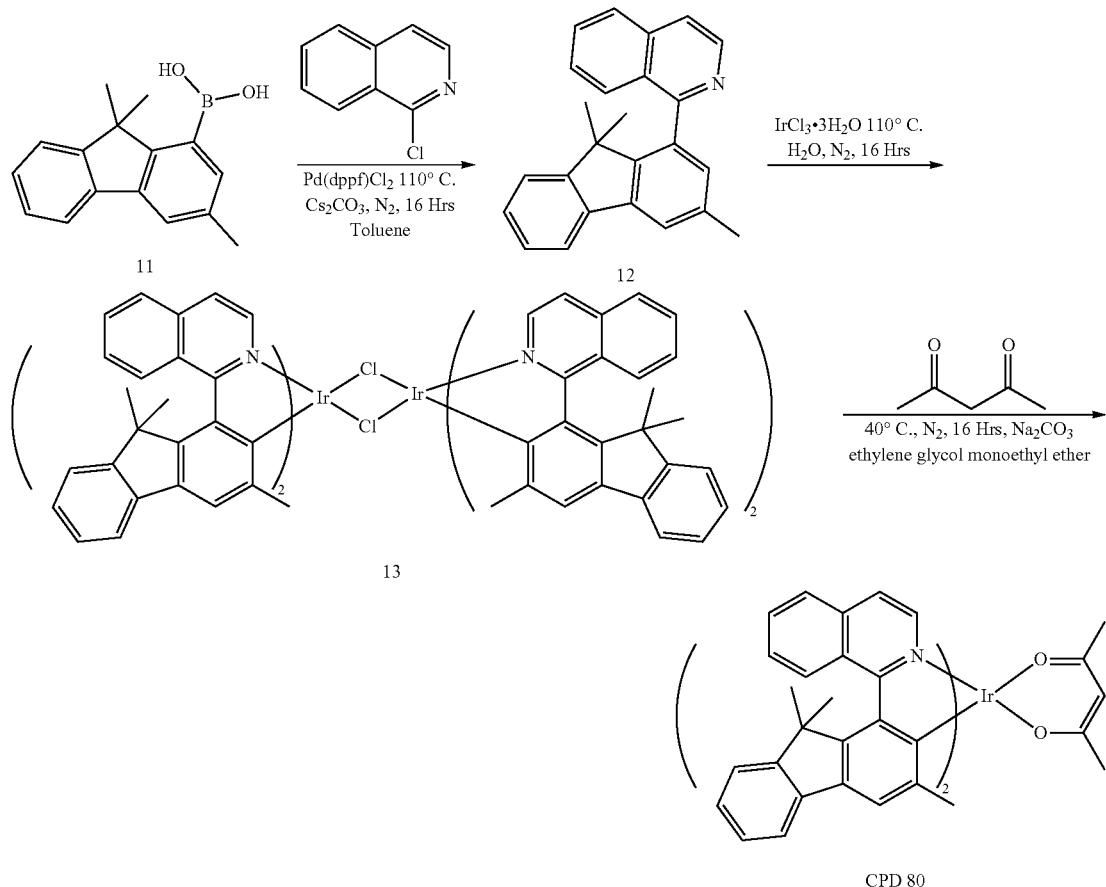

Synthesis of Compound 12:

Compound 11 (30.3 g, 0.12 mol, 1.2 eq), 1-chloroisoquinoline (16.3 g, 0.1 mol, 1.0 eq) and Cs$_2$CO$_3$ (97.5 g, 0.3 mol, 3.0 eq) and Pd(dppf)Cl$_2$ (3.655 g, 0.05 mol, 0.05 eq) were put into a flask. 1 L of anhydrous toluene was added. Under the protection effect of N$_2$, stirring back flow was performed at 110° C. for 16 h. Cooling was performed to reach a room temperature, and concentration was performed to remove an organic solvent. 1 L of dichloromethane and 1 L of water were added into residues, and stirring delamination was performed. An organic phase was sequentially washed by H$_2$O (500 ml*3) and a saturated sodium chloride aqueous solution (500 ml*3). After drying by sodium sulphate, filtration was performed. An organic solvent was removed from filter liquor through concentration. Off white solids were obtained. The solids were separated through column chromatography, and Compound 12 (21.34 g, yield: 63.7%) was obtained. Mass spectrum: 336.17 (M+H), 1HNMR: 8.51 (d, 1H), 7.71-7.82 (m, 5H), 7.50-7.60 (m, 3H), 7.30-7.4 (m, 2H), 7.10 (d, 1H), 2.32 (s, 3H), 1.67 (s, 6H).

Synthesis of Compound 13:

Compound 12 (20.1 g, 0.06 mol, 3.0 eq) and IrCl$_3$ 3H$_2$O (7.04 g, 0.02 mol, 1.0 eq) were put into a flask. 2-ethoxy-ethanol (133.4 ml) and deionized water (66.7 ml) were added. A mixed solution was subjected to stirring back flow at 110° C. for 16 h under the protection effect of N$_2$. After the cooling to a room temperature, filtration was performed. Filter residues were sequentially dried by methanol (100 ml*3) and n-hexane (100 ml*3) to obtain Compound 13 (8.96 g, 49.9%). The obtained compound was directly used for a next step without purification.

Synthesis of CPD 80:

Synthesis and purification methods were the same as those of CPD 1, and a target compound CPD 80 (3.54 g, 47.9%) was obtained. 3.54 g of CPD 80 crude products were sublimated and purified to obtain sublimated pure CPD 80 (2.45 g, 69.2%). Mass spectrum: 961.33 (M+H)

Corresponding materials were selected, and could be used for synthesis and sublimation by the same similar methods to obtain other compounds.

Application example: manufacture of organic electroluminescence device

A 50 mm*50 mm*1.0 mm glass substrate with an ITO (100 nm) transparent electrode was ultrasonically cleaned for 10 min in ethanol. After drying at 150° C., N$_2$ Plasma treatment was performed for 30 min. The washed glass substrate was mounted on a substrate support of a vacuum evaporation device. Firstly, a compound HATCN was evaporated on the surface of one side with a transparent electrode wire in a mode of covering a transparent electrode to form a thin film with a thickness of 5 nm. Then, a layer of HTM1 was evaporated to form a thin film with a thickness of 60 nm. Next, a layer of HTM2 was evaporated on the HTM1 thin film to form a thin film with a thickness of 10 nm. Then, a host material CBP and a doping compound (comparative compound X, CPD X) were evaporated on the HTM2 thin film in a co-evaporation mode, a thickness of the film is 30 nm, and a proportion of the host material to the doping material was 90%: 10%. An AlQ3 film layer (25 nm) and an LiF film layer (1 nm) were sequentially evaporated on a light-emitting layer. Finally, a layer of metal Al (100 nm) was evaporated to be used as an electrode.

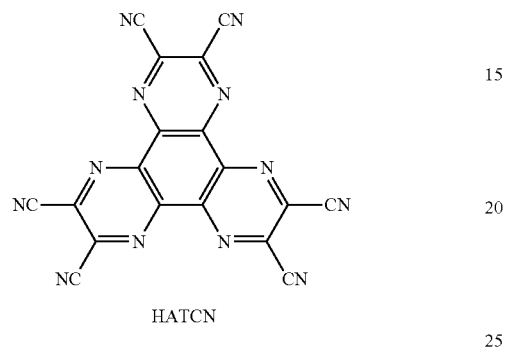

HATCN

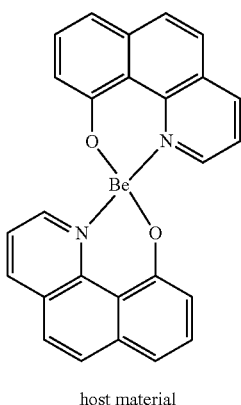

host material

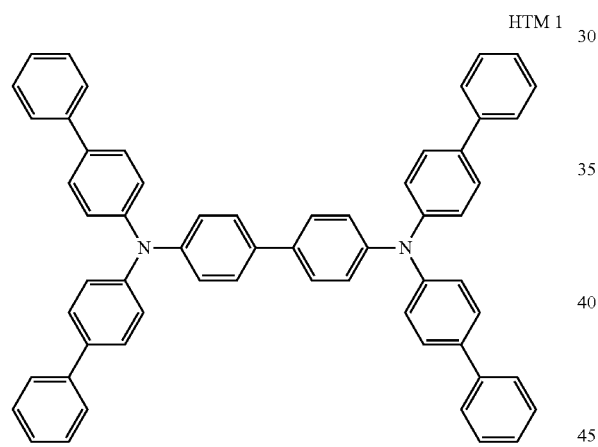

HTM 1

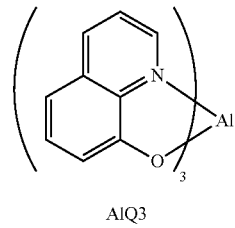

AlQ3

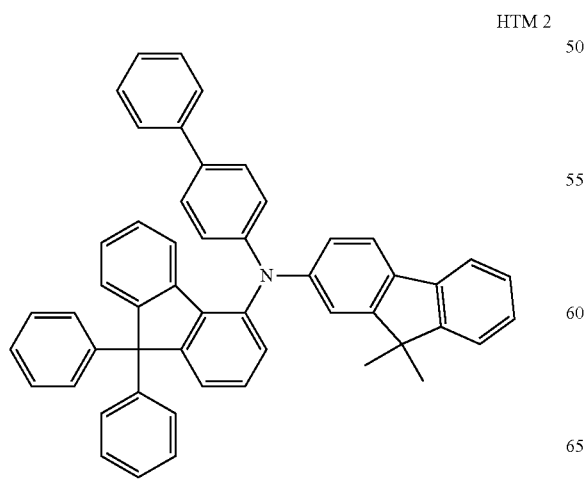

HTM 2

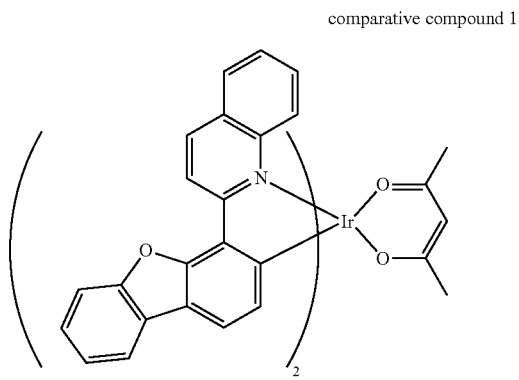

comparative compound 1 comparative compound 2

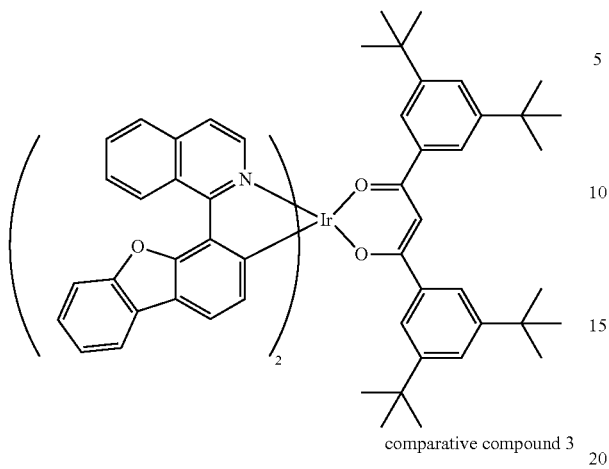

comparative compound 3

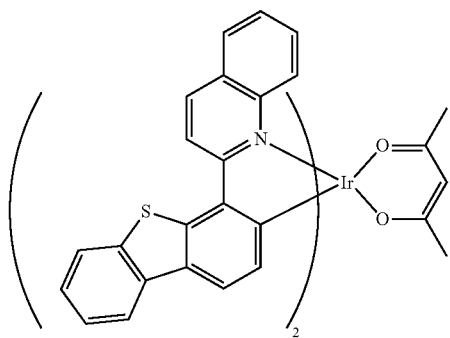

comparative compound 4

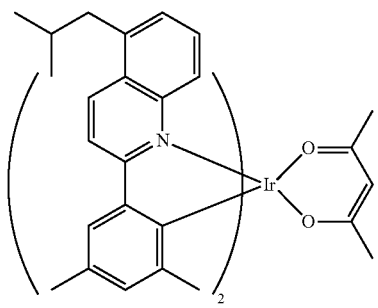

Evaluation: The above devices were subjected to device performance test. In each embodiment and comparative example, a constant current power supply (Keithley 2400) was used, current with a constant current density flowed through a light-emitting element, and a spectroradiometry radiation luminance meter (CS 2000) was used for testing the light-emitting spectrum. At the same time, a voltage value was measured, and the time (LT90) that the test brightness was 90% of the initial brightness was measured. The results were as follows:

|  | Doping material | Starting voltage V | Current efficiency Cd/A | Power efficiency lm/W | Peak wavelength nm | LT90@ 3000 nits |
|---|---|---|---|---|---|---|
| Embodiment 1 | CPD 1 | 4.21 | 24 | 17.90 | 614 | 162 |
| Embodiment 2 | CPD 3 | 4.12 | 28 | 21.34 | 615 | 178 |
| Embodiment 3 | CPD 13 | 4.05 | 31 | 24.03 | 620 | 211 |
| Embodiment 4 | CPD 16 | 3.99 | 33 | 25.97 | 626 | 232 |
| Embodiment 5 | CPD 17 | 3.97 | 30 | 23.73 | 623 | 235 |
| Embodiment 6 | CPD 18 | 3.96 | 32 | 25.37 | 622 | 264 |
| Embodiment 7 | CPD 19 | 3.88 | 32 | 25.90 | 622 | 268 |
| Embodiment 8 | CPD 22 | 3.86 | 34 | 27.66 | 628 | 312 |
| Embodiment 9 | CPD 23 | 3.79 | 32 | 26.51 | 625 | 295 |
| Embodiment 10 | CPD 24 | 3.82 | 31 | 25.48 | 624 | 281 |
| Embodiment 11 | CPD 79 | 3.98 | 26 | 20.51 | 616 | 168 |
| Embodiment 12 | CPD 80 | 4.11 | 28 | 21.39 | 615 | 176 |
| Comparative example 1 | Comparative compound 1 | 4.56 | 21 | 14.46 | 610 | 102 |
| Comparative example 2 | Comparative compound 2 | 4.41 | 20 | 14.24 | 612 | 116 |
| Comparative example 3 | Comparative compound 3 | 4.64 | 21 | 14.21 | 611 | 94 |
| Comparative example 4 | Comparative compound 4 | 4.88 | 18 | 11.58 | 608 | 82 |

Through comparison of data in the above table, it could be known that compared with that using comparative compounds, an organic electroluminescence device using the compound of the present invention as a dopant showed more excellent performance in aspects of driving voltage, luminous efficiency and device lifetime.

Comparison of sublimation temperature: the sublimation temperature is defined as the temperature corresponding to a vacuum degree of 10-7 Torr and an evaporation rate of 1 angstrom per second. The test results were as follows:

| Doping material | Sublimation temperature |
|---|---|
| CPD 1 | 263 |
| CPD 3 | 262 |
| CPD 13 | 252 |
| CPD 16 | 258 |
| CPD 17 | 260 |
| CPD 18 | 262 |
| CPD 19 | 254 |
| CPD 22 | 259 |
| CPD 23 | 260 |
| CPD 24 | 261 |
| CPD 79 | 262 |
| CPD 80 | 261 |
| Comparative compound 1 | 280 |
| Comparative compound 2 | 288 |
| Comparative compound 3 | 286 |
| Comparative compound 4 | 276 |

Through comparison of data in the above table, it could be known that the compound of the present invention has a lower sublimation temperature, and is favorable for industrial application.

The above results show that the compound of the present invention has the advantages of low sublimation temperature, high light and electrochemical stability, high color saturation, high luminous efficiency, long lifetime of a device and the like, can be used in an organic electroluminescence device, and can be particularly used as a red light emitting dopant to realize the possibility of being applied to OLED industry.

The invention claimed is:

1. An organometallic compound, having a structural formula as shown in Formula I:

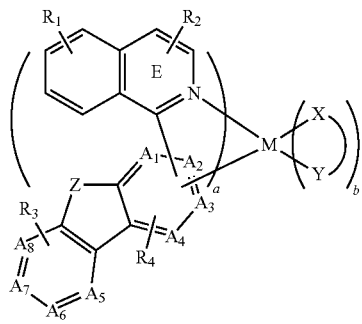

(I)

wherein:
one in $A_1$ to $A_4$ is a C—C bond connected with a ring E, one is a C-M bond connected with metal M, one is $CR_4$, and another is $CR_0$ or N;

one in $A_5$ to $A_8$ is $CR_3$, and the other three are independently represented as $CR_0$ or N;

M is a metal with the atomic weight greater than 40;

$R_0$ to $R_4$ are independently selected from hydrogen, deuterium, halogen, a substituted or unsubstituted C1 to C10 alkyl group, a substituted or unsubstituted C3 to C20 cycloalkyl group, a substituted or unsubstituted C1 to C10 heteroalkyl group, a substituted or unsubstituted C6 to C30 aralkyl group, a substituted or unsubstituted C1 to C10 alkoxy group, a substituted or unsubstituted C6 to C30 aryloxy group, an amino group, a substituted or unsubstituted C1 to C10 silyl group, a substituted or unsubstituted C6 to C30 aryl group, a substituted or unsubstituted C1 to C8 heteroaryl group, a cyano group, a isocyano group, or a phosphino group, wherein the substitution refers to substitution by deuterium, F, Cl, Br, a C1 to C4 alkyl group, a C1 to C4 alkoxy group, a C3 to C6 cycloalkyl group, an amino group substituted by a C1 to C4 alkyl group, a cyano group, a isocyano group or a phosphino group;

at least one of $R_3$ and $R_4$ is not hydrogen;

Z is independently selected from O, S, Se, $C(R)_2$, $Si(R)_2$, NR, BR or POR, wherein R is independently selected from a substituted or unsubstituted C1 to C10 alkyl group or a substituted or unsubstituted C1 to C10 alkoxy group, a substituted or unsubstituted C3 to C30 cycloalkyl group, a substituted or unsubstituted C6 to C 30 aryl group, a substituted or unsubstituted C1 to C18 heteroaryl group; and X-Y is a monoanionic bidentate ligand, wherein the sum of a and b equals to a valence state of the metal M.

2. The organometallic compound according to claim 1, wherein:
X-Y is a OO type and CN type ligand; and
M is one of metals in Os, Ir, Pt, Pd, Ru, Rh or Au.

3. The organometallic compound according to claim 2, having a structure as shown in Formula II:

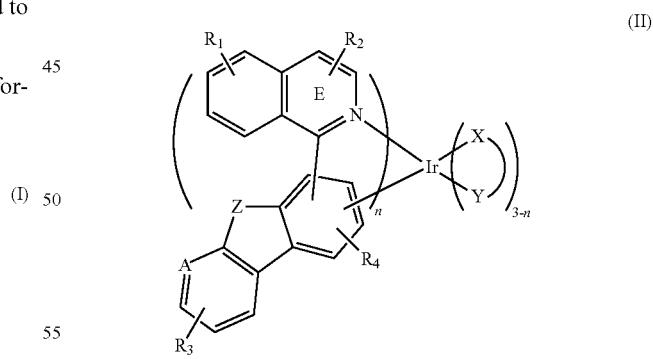

(II)

wherein:
n is a positive integer of 1 to 2;
A is $CR_0$ or N;
$R_0$ to $R_4$ are independently selected from hydrogen, deuterium, a substituted or unsubstituted C1 to C8 alkyl group, a substituted or unsubstituted C1 to C10 heteroalkyl group, a substituted or unsubstituted C3 to C20 cycloalkyl group, a substituted or unsubstituted C6 to C8 aralkyl group, a substituted or unsubstituted C3 to C10 silyl group, or a C6 to C8 aryl group or C1 to C8 heteroaryl group unsubstituted or substituted by a C1 to C4 alkyl group; and
at least one of $R_3$ and $R_4$ is not hydrogen.

4. The organometallic compound according to claim 3, wherein A is CH.

5. The organometallic compound according to claim 3, wherein A is N.

6. The organometallic compound according to claim 5, wherein an $R_3$ substituent group is located adjacent to N.

7. The organometallic compound according to claim 5, wherein $R_3$ is D or an alkyl group with at most 4 carbon atoms.

8. The organometallic compound according to claim 7, wherein $R_3$ is an alkyl group at least containing one D.

9. The organometallic compound according to claim 8, wherein $R_3$ is CD3.

10. The organometallic compound according to claim 3, wherein the position of $R_4$ substituent group is a position adjacent to metal Ir—C bond.

11. The organometallic compound according to claim 3, wherein the position of $R_4$ substituent group is a position opposite to metal Ir—C bond.

12. The organometallic compound according to claim 1, wherein:
Z is O, S, NR or C(R) 2, and
R is independently selected from a substituted or unsubstituted C1 to C8 alkyl group.

13. The organometallic compound according to claim 12, wherein X—Y is different from a left ligand.

14. The organometallic compound according to claim 13, wherein X—Y is a 1,3-dione compound.

15. An organic electroluminescence device, comprising the organometallic compound according to claim 1.

16. An organic electroluminescence device according to claim 15, comprising a light-emitting layer, the light-emitting layer comprising a doped material of a phosphorescent host material, wherein the doped material is the organometallic compound according to claim 1.

17. The organometallic compound according to claim 3, having one of the following compounds:

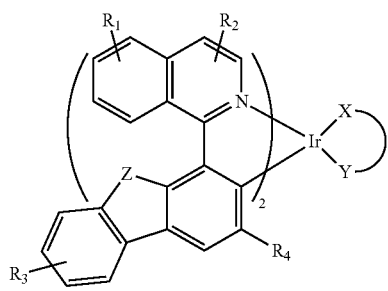

Formula II

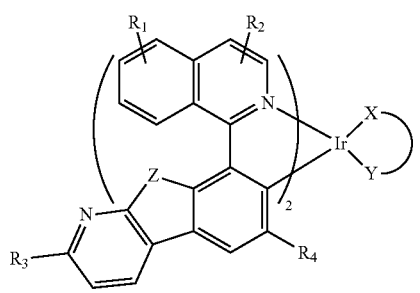

Formula IV

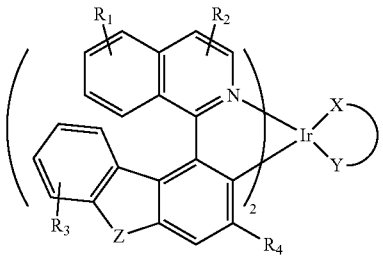

Formula V

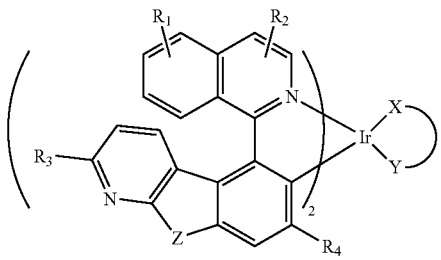

Formula VI

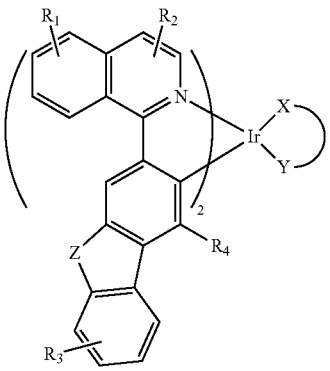

Formula VII

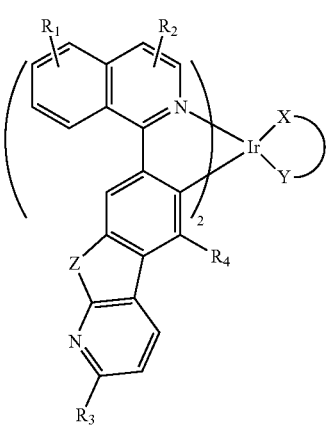

Formula VIII

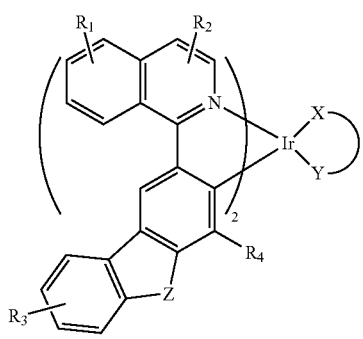

Formula IX

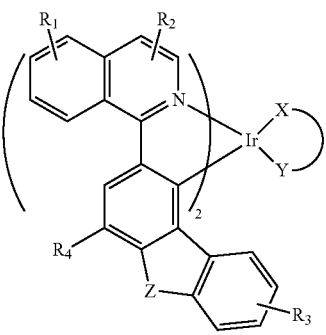

Formula XIII

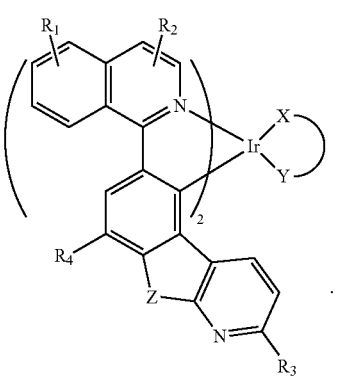

Formula XIV

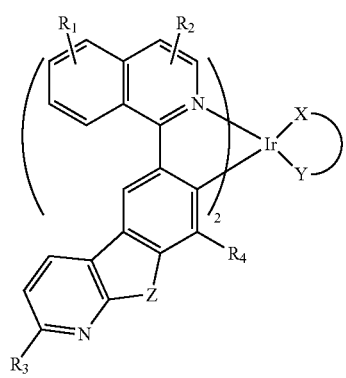

Formula X

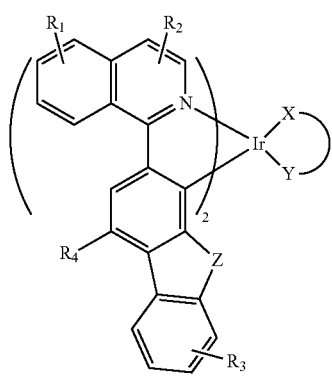

Formula XI

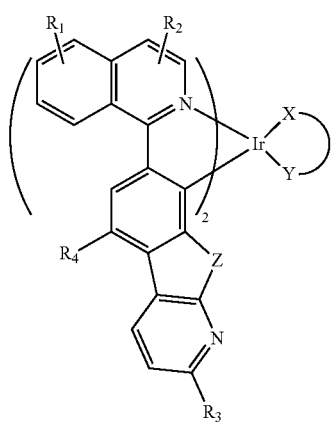

Formula XII

18. The organometallic compound according to claim 17, wherein:

Z is O, S or C(R)$_2$, R$_1$ to R$_4$ are independently selected from hydrogen, deuterium, a substituted or unsubstituted C1 to C4 alkyl group, a substituted or unsubstituted C3 to C20 cycloalkyl group, a substituted or unsubstituted C6 to C8 aralkyl group, or a C6 to C8 aryl group or C6 to C8 heteroaryl group unsubstituted or substituted by a C1 to C4 alkyl group; and at least one of R$_3$ and R$_4$ is not hydrogen.

19. The organometallic compound according to claim 18, wherein:

R$_1$ to R$_4$ are independently selected from hydrogen, deuterium, a substituted or unsubstituted C1 to C4 alkyl group, a substituted or unsubstituted C3 to C20 cycloalkyl group, or a phenyl group substituted by a C1 to C4 alkyl group; and at least one of R$_3$ and R$_4$ is not hydrogen.

20. The organometallic compound according to claim 19, having one of the following structural formulas:

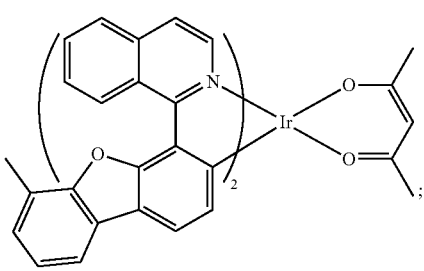

CPD 1

CPD 2
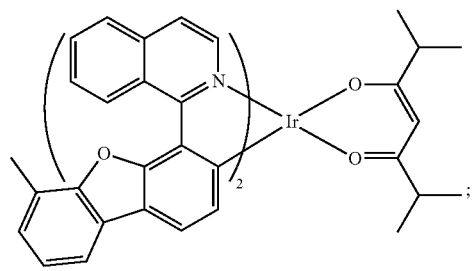
CPD 3
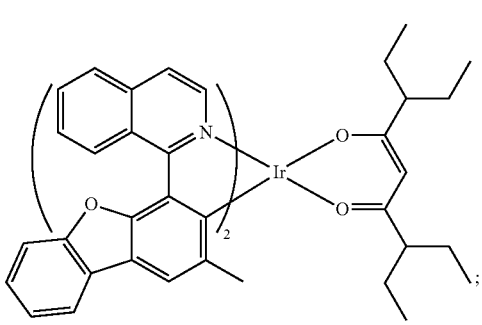
CPD 4
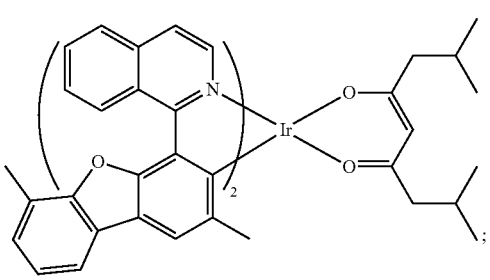
CPD 5
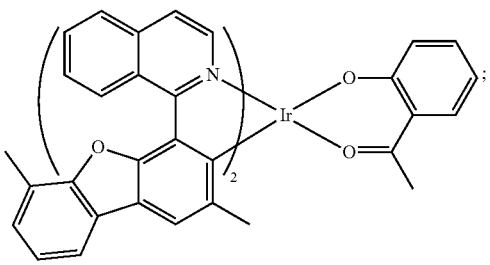
CPD 6
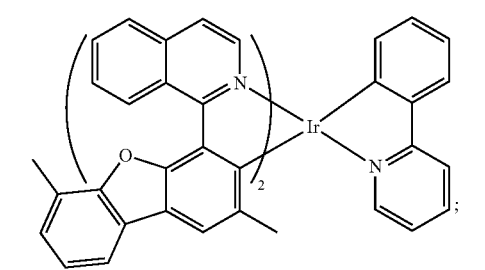
CPD 7
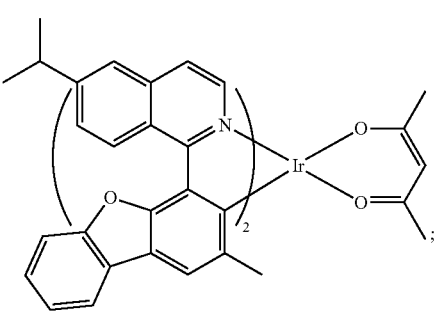
CPD 8
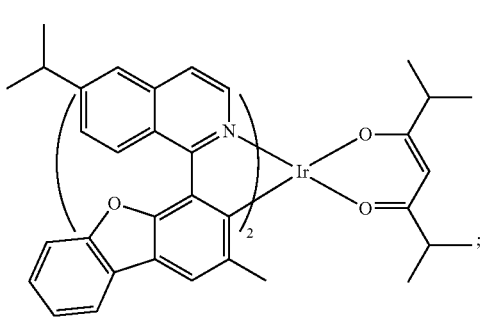
CPD 9
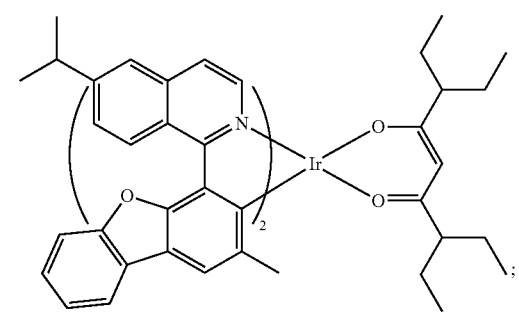
CPD 10
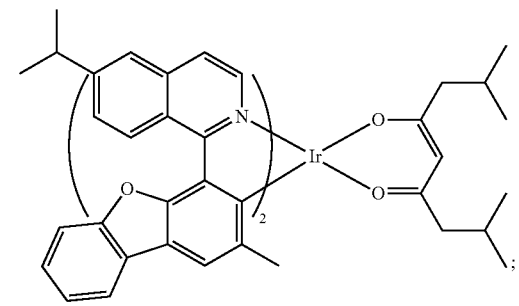
CPD 11
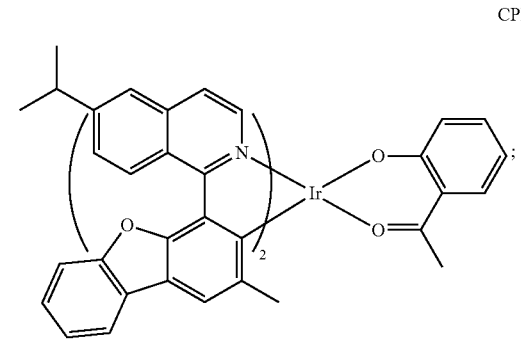

CPD 12
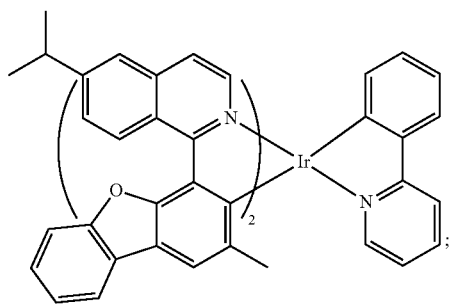
CPD 17
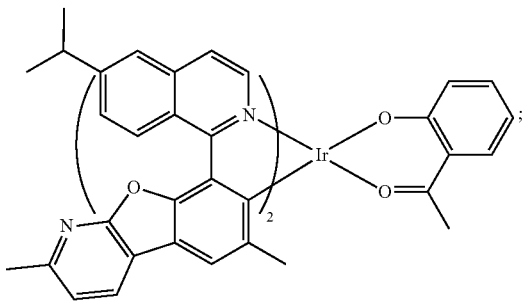
CPD 13
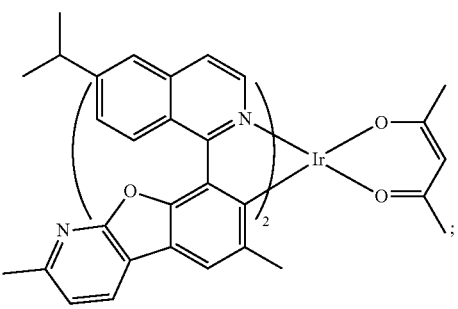
CPD 18
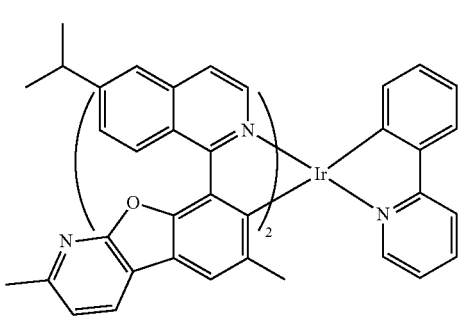
CPD 14
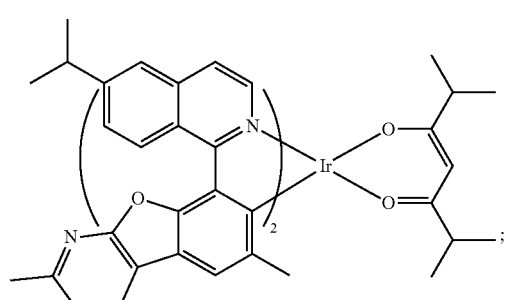
CPD 19
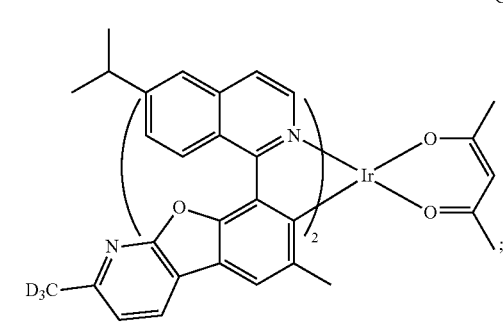
CPD 15
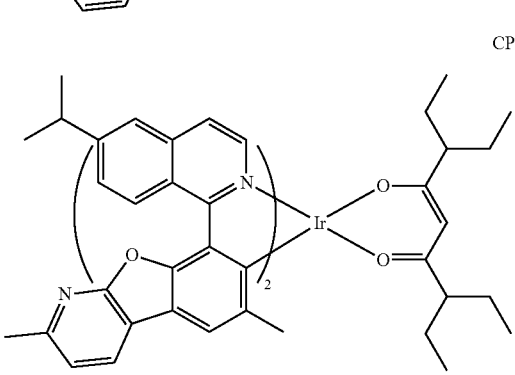
CPD 20
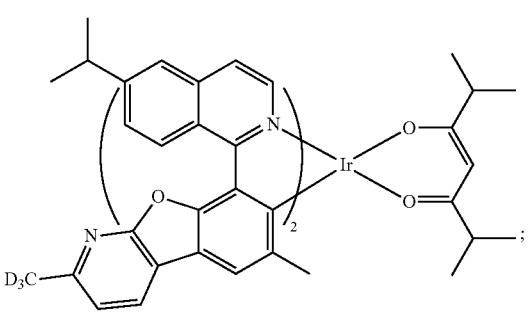
CPD 16
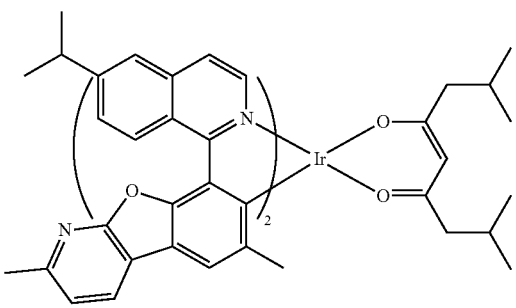
CPD 21
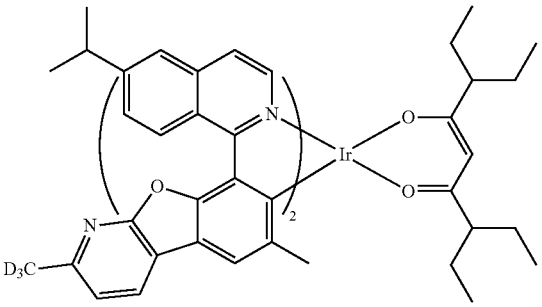

CPD 22
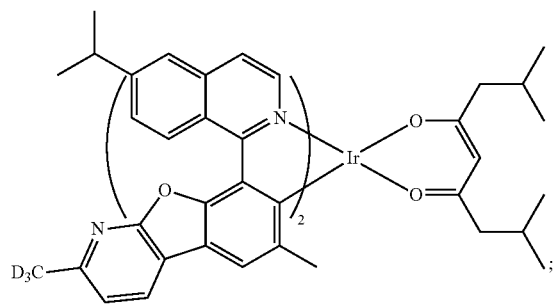
CPD 23
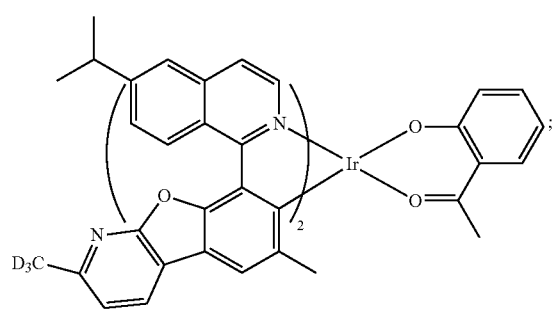
CPD 24
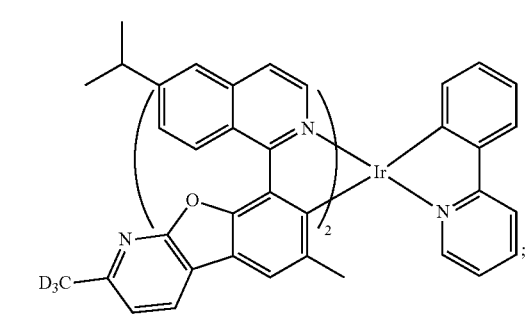
CPD 25
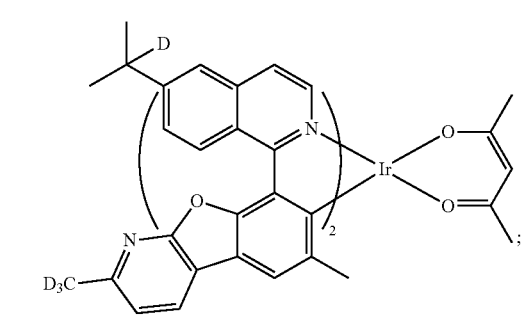
CPD 26
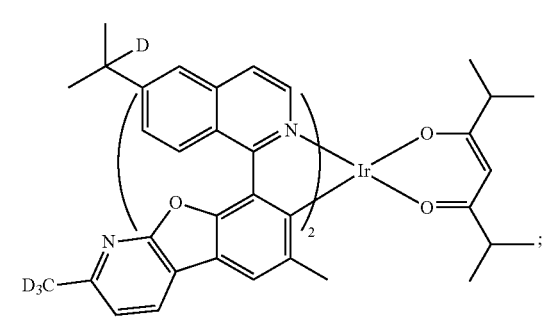
CPD 27
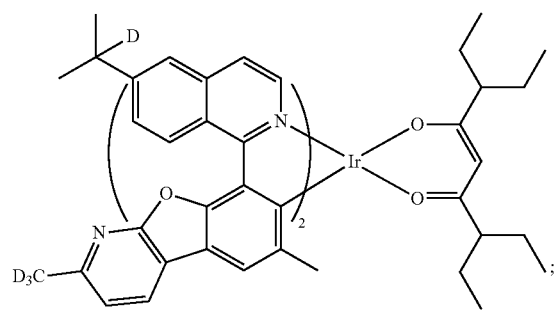
CPD 28
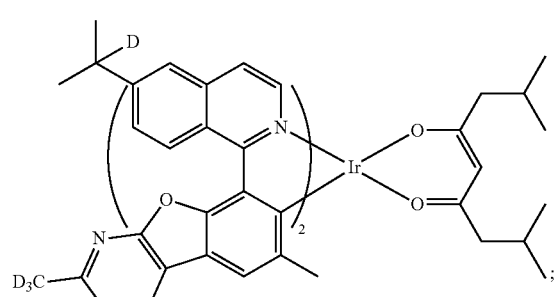
CPD 29
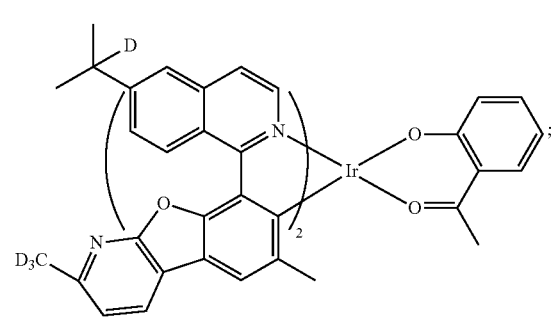
CPD 30
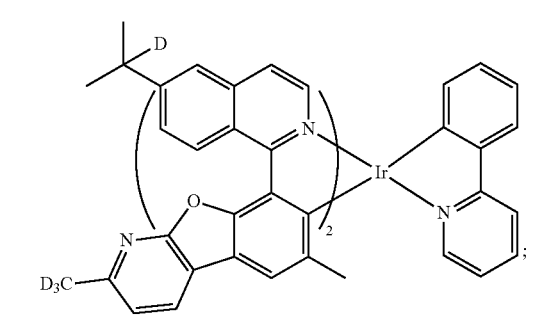
CPD 31
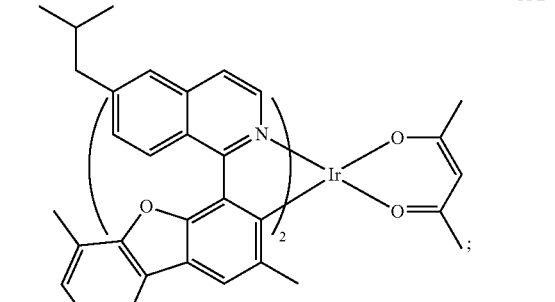

CPD 32
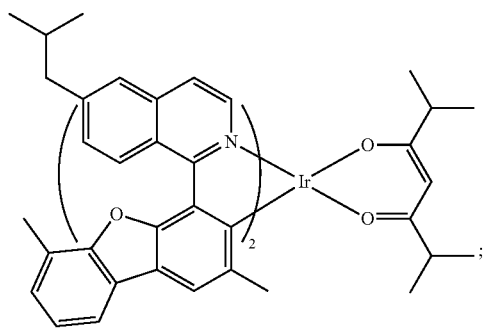
CPD 33
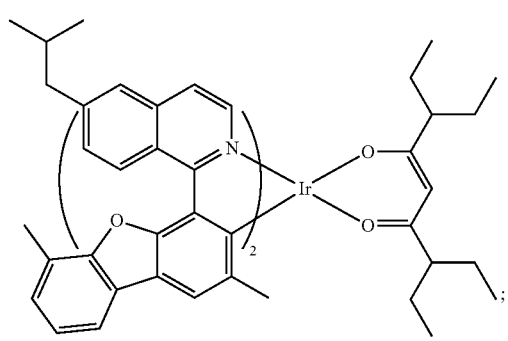
CPD 34
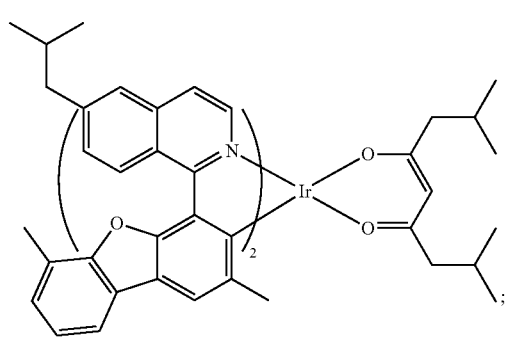
CPD 35
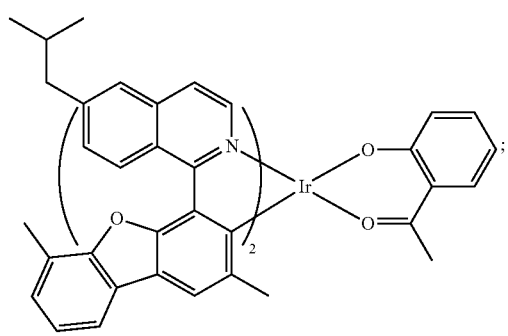
CPD 36
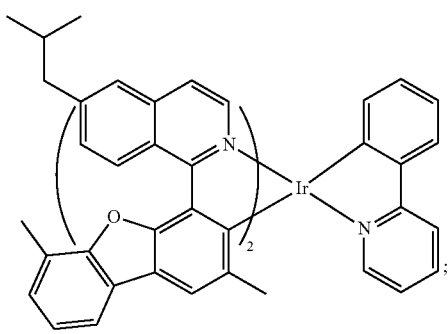
CPD 37
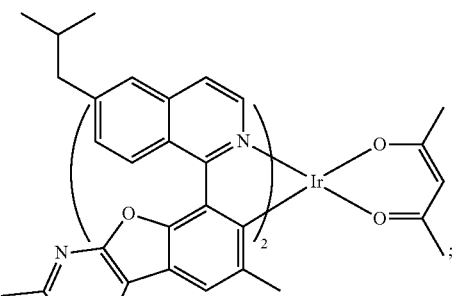
CPD 38
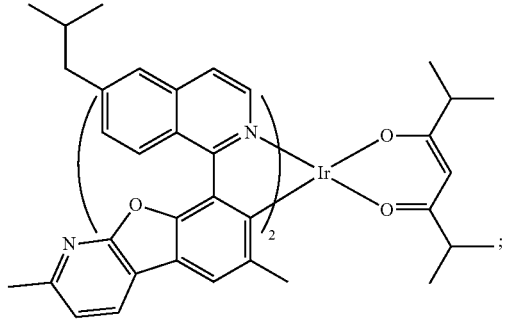
CPD 39
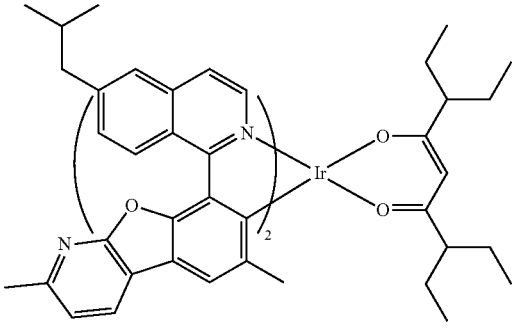

CPD 40
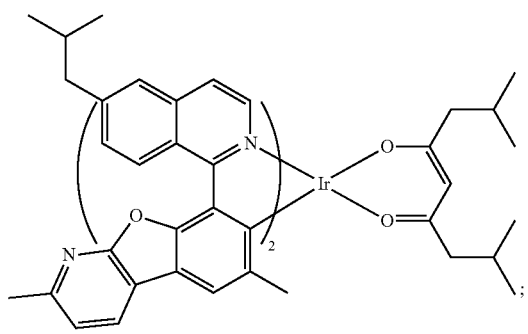
CPD 41
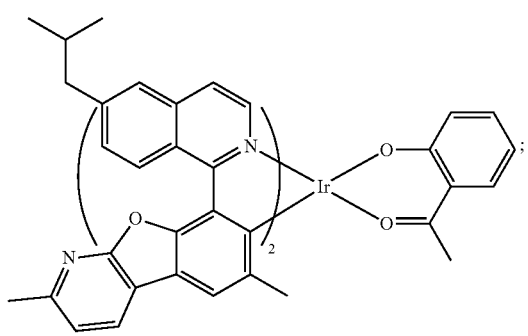
CPD 42
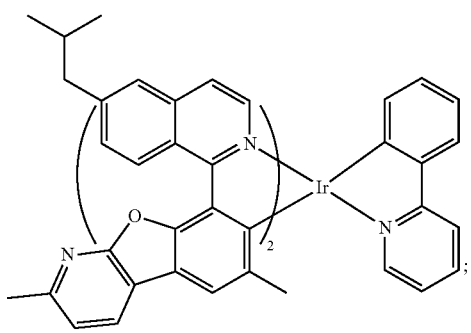
CPD 43
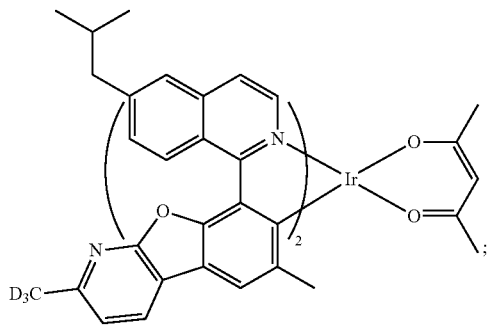
CPD 44
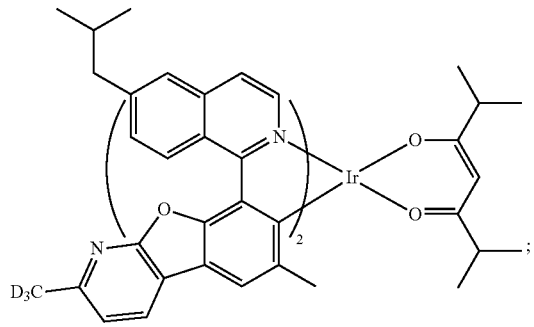
CPD 45
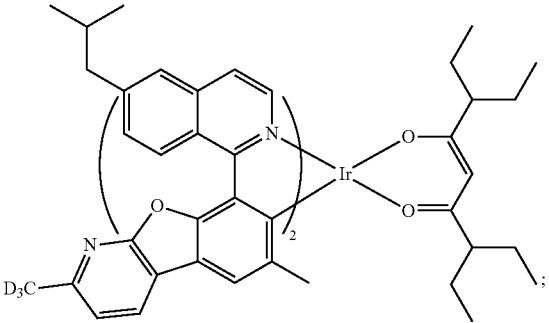
CPD 46
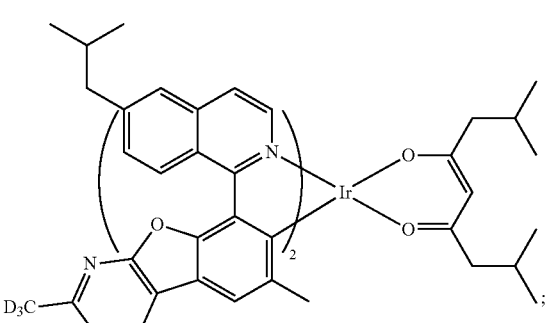
CPD 47
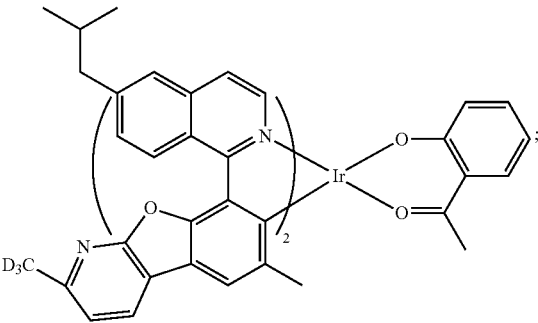

CPD 48
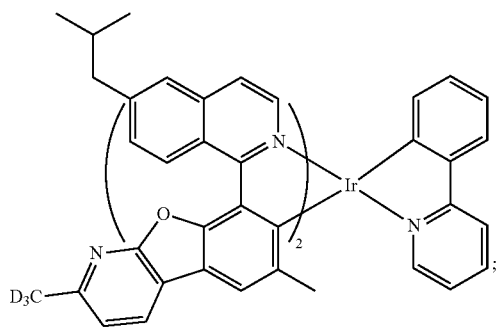
CPD 49
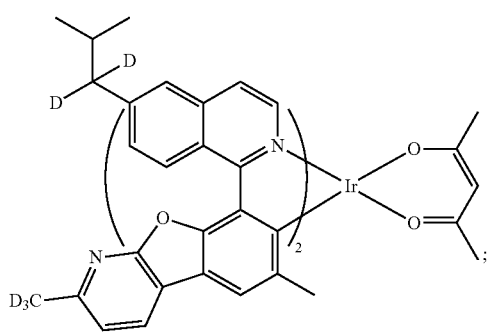
CPD 50
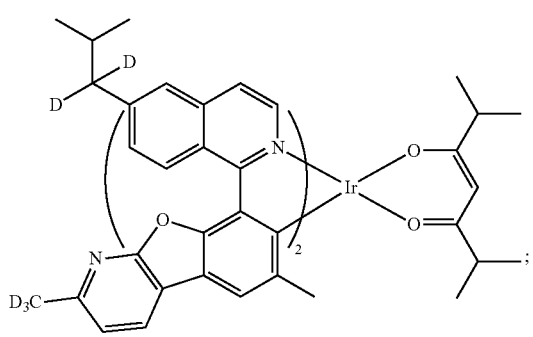
CPD 51
CPD 52
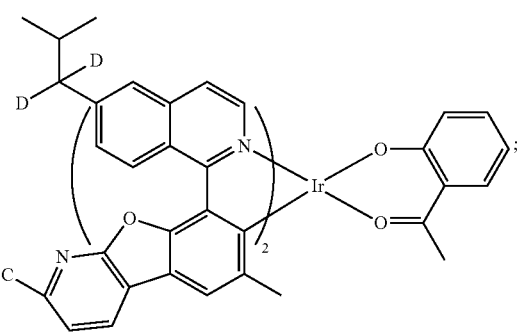
CPD 53
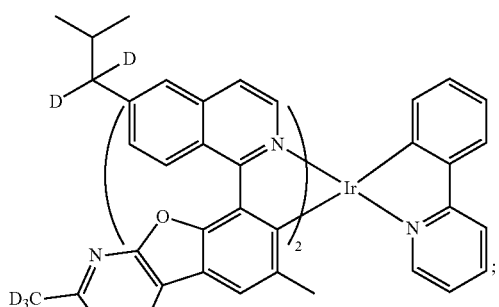
CPD 54
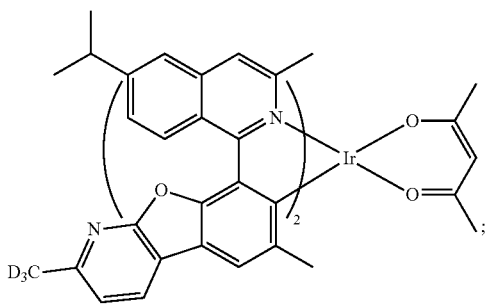
CPD 55

CPD 56
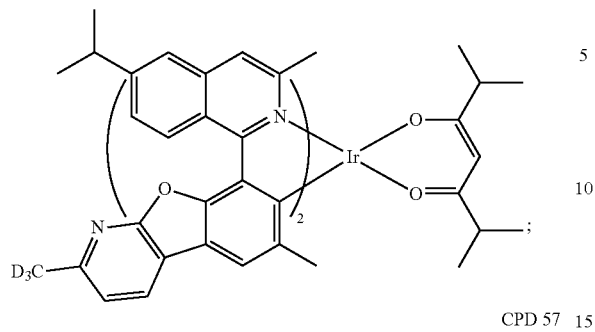
CPD 57
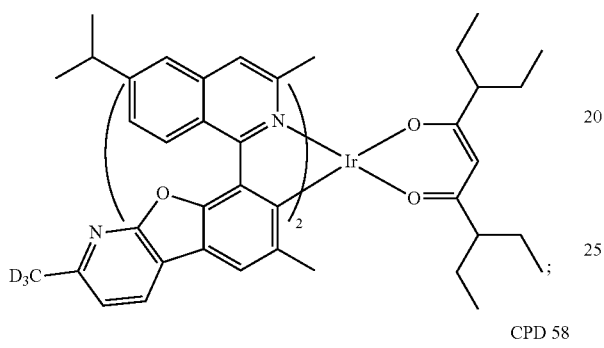
CPD 58
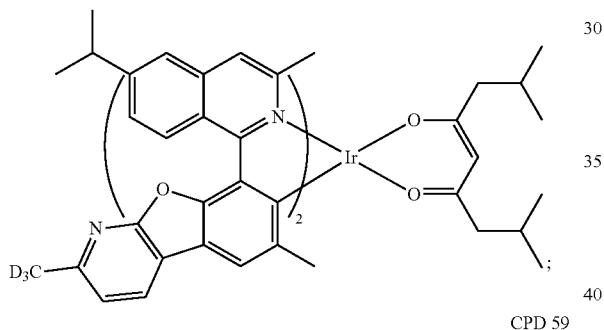
CPD 59
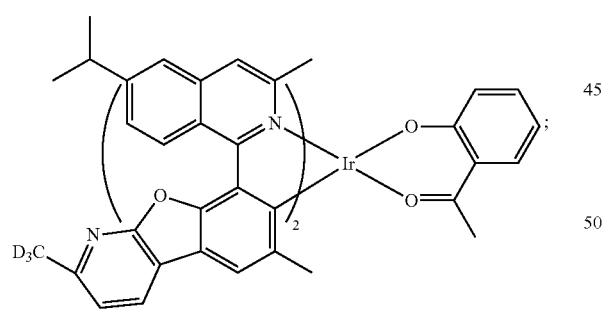
CPD 60
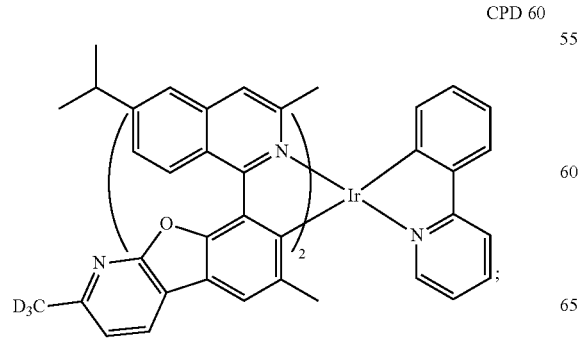
CPD 61
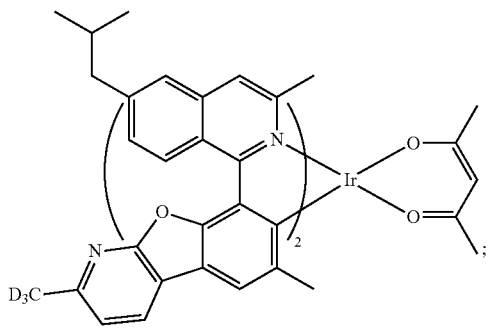
CPD 62
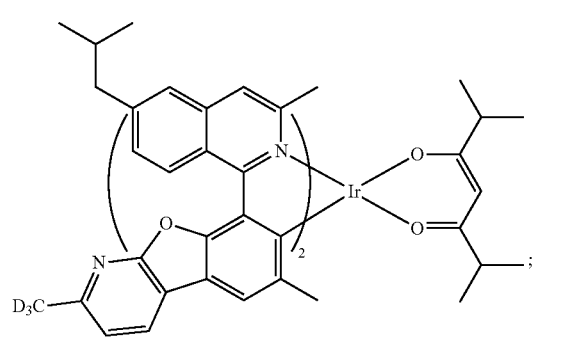
CPD 63
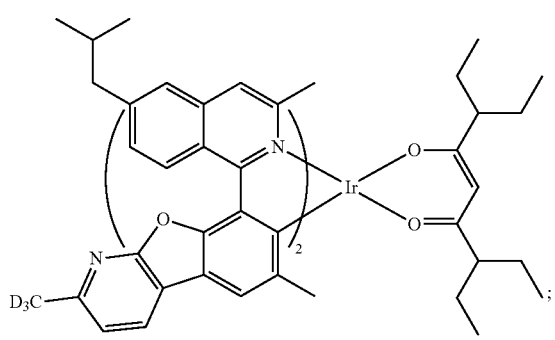
CPD 64
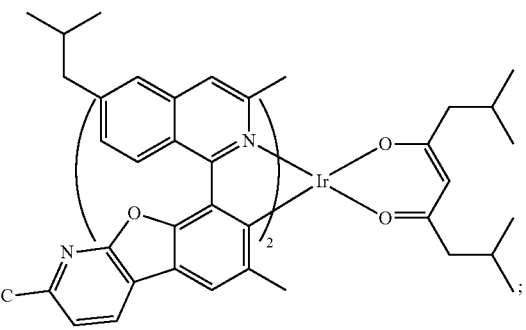

CPD 65
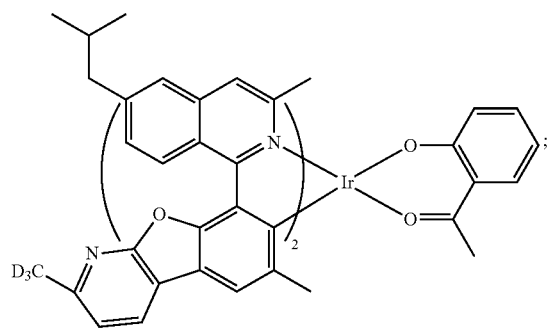
CPD 66
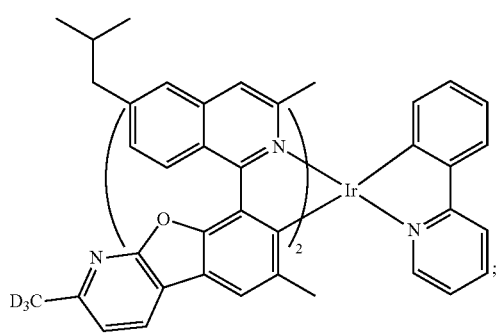
CPD 67
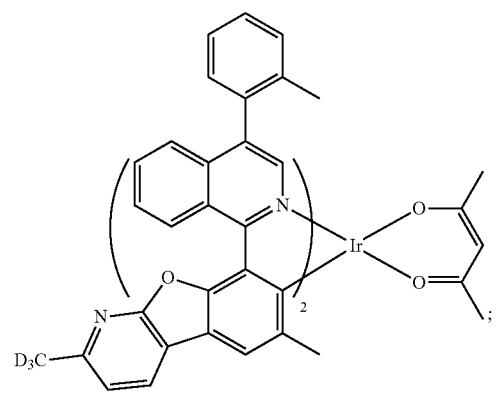
CPD 68
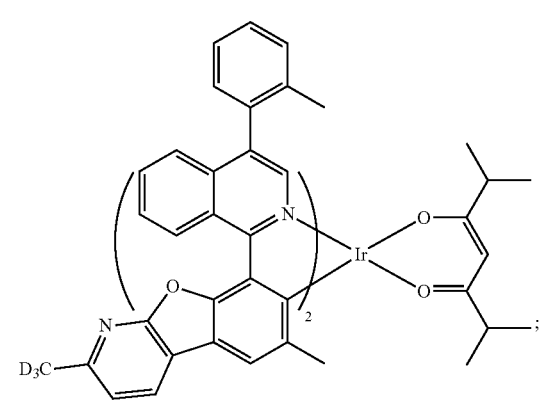
CPD 69
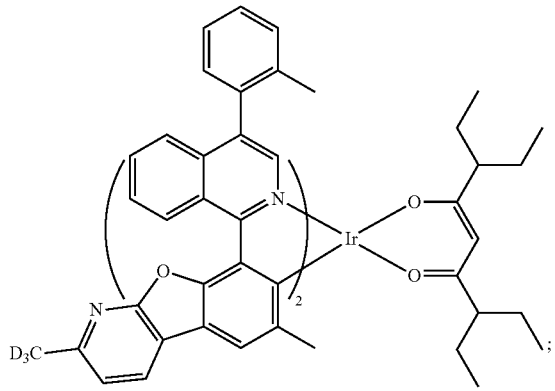
CPD 70
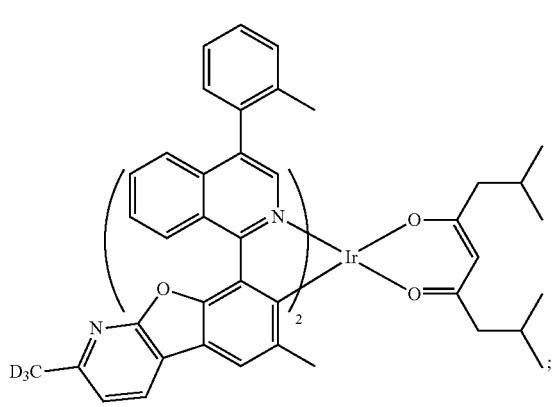
CPD 71
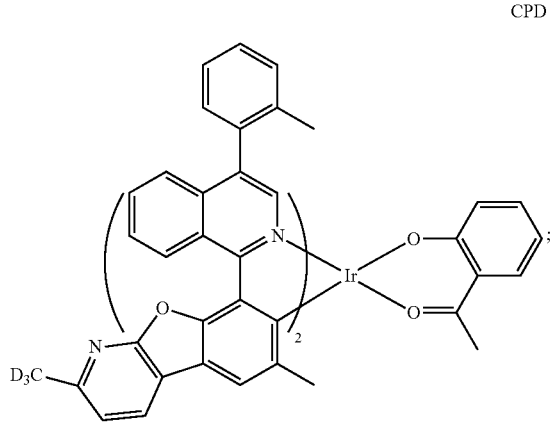
CPD 72
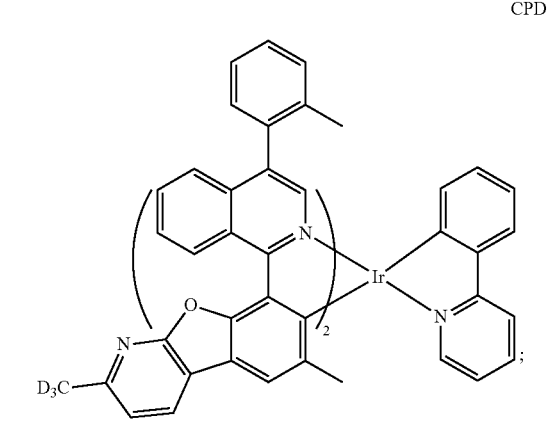

CPD 73
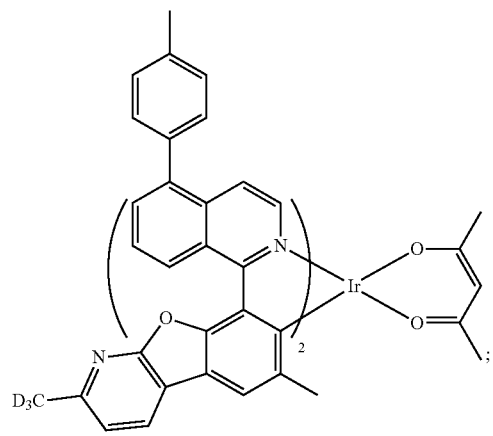
CPD 74
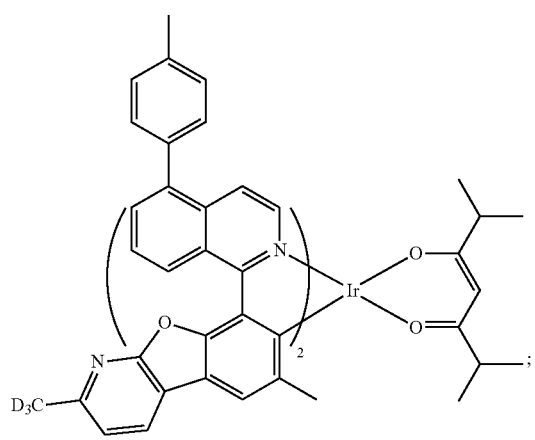
CPD 75
CPD 76
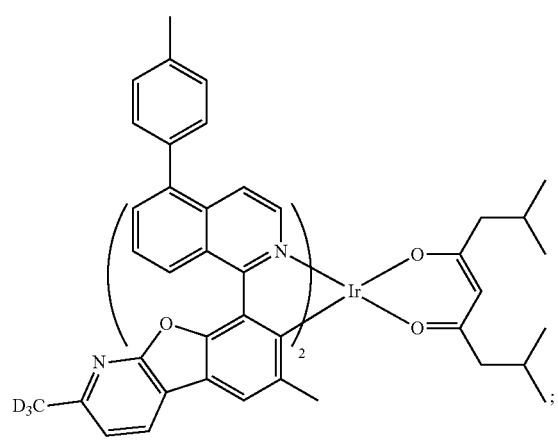
CPD 77
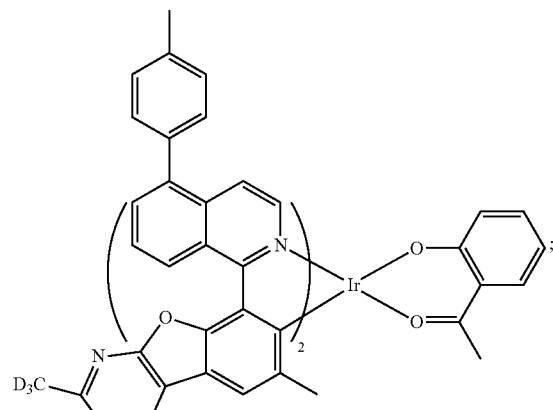
CPD 78
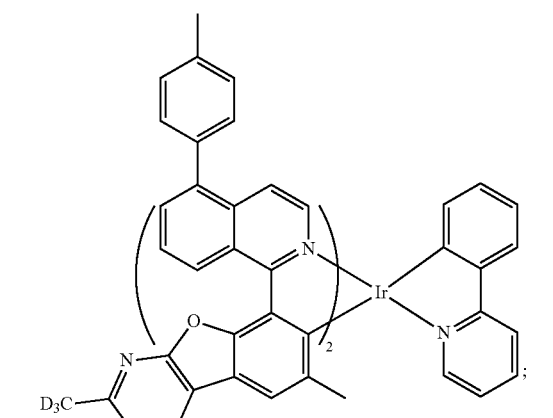
CPD 79
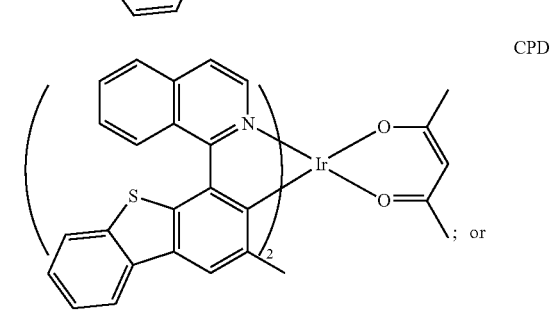

-continued
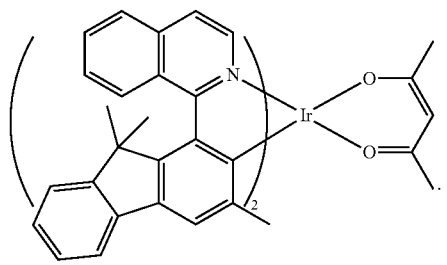
CPD 80
* * * * *